(12) United States Patent
Watanabe

(10) Patent No.: US 6,850,178 B2
(45) Date of Patent: Feb. 1, 2005

(54) ANALOG-TO-DIGITAL CONVERSION METHOD AND DEVICE

(75) Inventor: Takamoto Watanabe, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/192,605

(22) Filed: Jul. 10, 2002

(65) Prior Publication Data

US 2003/0011502 A1 Jan. 16, 2003

(30) Foreign Application Priority Data

Jul. 13, 2001 (JP) .................................. 2001-213966

(51) Int. Cl.[7] .............................................. H03M 1/12
(52) U.S. Cl. ....................... 341/155; 341/129; 341/163
(58) Field of Search ............................... 341/129, 155, 341/163; 324/166; 327/3; 363/132

(56) References Cited

U.S. PATENT DOCUMENTS

| | | | |
|---|---|---|---|
| 5,128,624 A | * | 7/1992 | Hoshino et al. ............... 327/3 |
| 5,396,247 A | | 3/1995 | Watanabe et al. |
| 5,525,899 A | * | 6/1996 | Watanabe et al. ........... 324/166 |
| 6,255,976 B1 | | 7/2001 | Watanabe et al. |
| 6,307,496 B1 | | 10/2001 | Ikuta et al. |
| 6,347,046 B1 | * | 2/2002 | Ono et al. ................... 363/132 |
| 6,466,151 B2 | * | 10/2002 | Nishii et al. ................. 341/155 |
| 6,556,164 B2 | * | 4/2003 | Schmid ....................... 341/163 |

FOREIGN PATENT DOCUMENTS

| | | |
|---|---|---|
| JP | A-5-259907 | 10/1993 |
| JP | A-5-37378 | 2/1995 |
| JP | A-7-154256 | 6/1995 |
| JP | A-11-44585 | 2/1999 |
| JP | A-11-64135 | 3/1999 |
| JP | A-2000-283790 | 10/2000 |

* cited by examiner

Primary Examiner—Jean Bruner Jeanglaude
(74) Attorney, Agent, or Firm—Harness, Dickey & Pierce, PLC

(57) ABSTRACT

An analog-to-digital conversion device is provided that uses pulse delay circuits to convert an input voltage into numerical data and offers a high resolution in analog-to-digital conversion or a high analog-to-digital conversion rate. The analog-to-digital conversion device includes an analog-to-digital conversion unit having a pulse delay circuit composed of a plurality of delay units. The delay units are driven with a voltage produced by amplifying or shifting an input voltage. The number of delay units through which a pulse signal has passed during a predetermined sampling cycle is adopted as a digitized value of the input voltage. Herein, delay units constituting another pulse delay circuit are driven with a voltage produced by inversely amplifying or shifting the input voltage. Every time the number of delay units through which a pulse signal has passed within the pulse delay circuit reaches a predetermined value determined with a set value, a sampling signal is transferred to the analog-to-digital conversion unit.

34 Claims, 11 Drawing Sheets

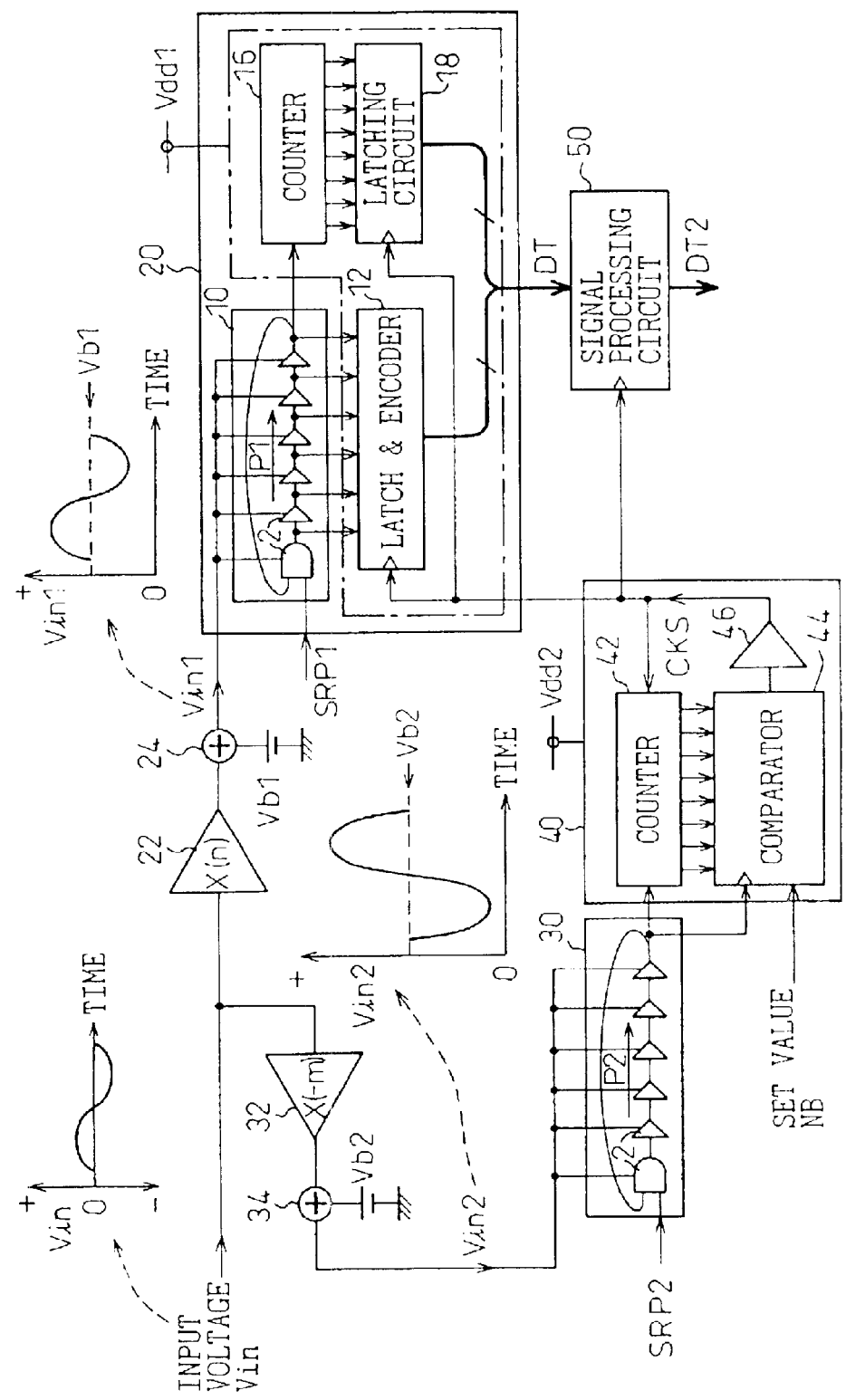

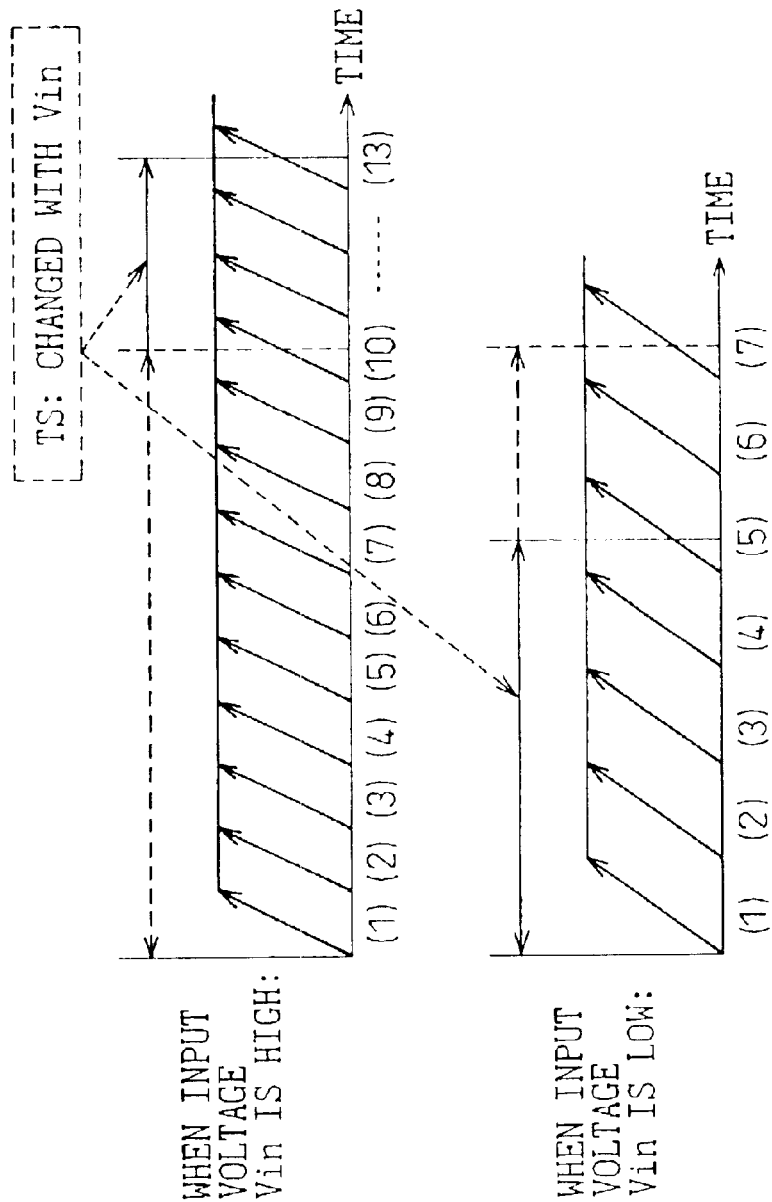

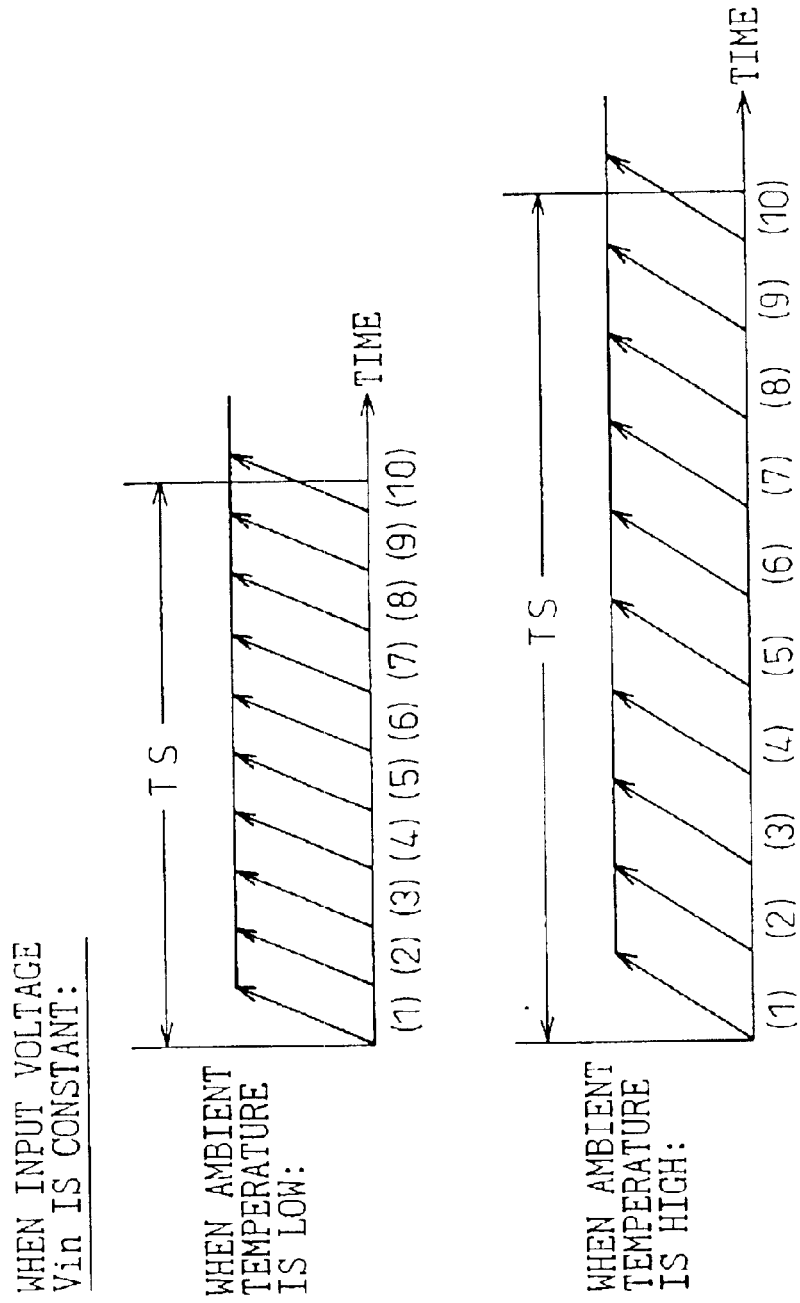

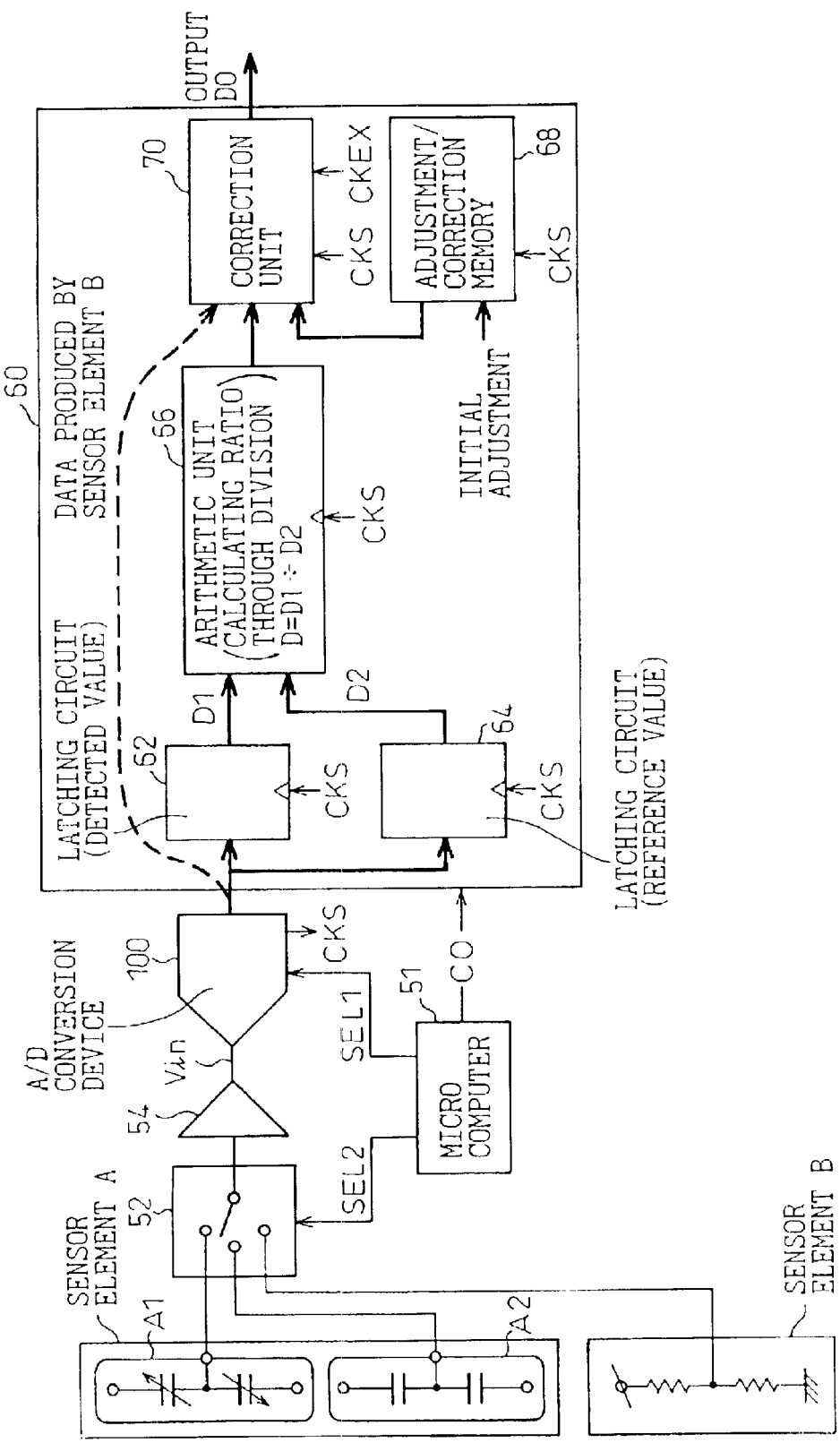

ANALOG-TO-DIGITAL CONVERSION METHOD AND DEVICE

BACKGROUND OF THE INVENTION

1. Field of the Invention

The present invention relates to an analog-to-digital conversion method and device for converting an input voltage into numerical data.

2. Description of the Related Art

In the past, analog-to-digital (A/D) conversion devices have been used to convert an input voltage into numerical data by utilizing a pulse delay circuit that has a plurality of delay units, each of which is realized with a gate circuit, connected in tandem. One analog-to-digital conversion device is disclosed in, for example, Japanese Unexamined Patent Publication Application No. 5-259907.

This type of analog-to-digital conversion device is configured as shown in, for example, FIG. 8A or FIG. 8B.

To begin with, the analog-to-digital conversion device shown in FIG. 8A has a pulse delay circuit 10 and a latch and encoder 12. The pulse delay circuit 10 has a plurality of delay units 2 connected in tandem. The delay unit 2 delays an input pulse Pin by a predetermined delay time and outputs it. The latch and encoder 12 detects (latches) the position of the input pulse Pin in the pulse delay circuit 10, to which the input pulse Pin has reached, at the leading edge (or trailing edge) of a sampling signal CKS that is received from outside. The latch and encoder 12 then converts the result of detection into digital data DT, which consists of a predetermined number of bits and represents how many delay units succeed the delay unit 2 through which the input pulse Pin has just passed, and transfers the digital data.

The delay units 2 constituting the pulse delay circuit 10 are realized with gate circuits each including an inverter or the like. An input voltage Vin that is an object of analog-to-digital conversion is applied to each delay unit 2 via a buffer 14 or the like.

Consequently, the delay time given by the delay unit 2 is proportional to the level of the input voltage Vin. Eventually, the number of delay units 2 through which the input pulse Pin has passed within the pulse delay circuit 10 during a sampling cycle TS of the sampling signal CKS is proportional to the level of the input voltage Vin.

For example, FIG. 9A graphically shows changes in outputs of the delay units 2(1), 2(2), 2(3), etc. occurring when the input pulse Pin is transferred within the pulse delay circuit 10. As is apparent from the drawing, when the input voltage Vin is high, the delay time given to the input pulse Pin by each delay unit 2 is short. Therefore, the number of delay units 2 through which the input pulse Pin passes within the pulse delay circuit 10 during a sampling cycle TS increases (in the drawing, ten delay units starting with the first delay unit 2(1) and ending with the tenth delay unit 2(10)). When the input voltage Vin is low, the delay time given to the input pulse Pin by each delay unit 2 is long. Therefore, the number of delay units 2 through which the input pulse Pin passes within the pulse delay circuit 10 during a sampling cycle TS decreases (in the drawing, seven delay units starting with the first delay unit 2(1) and ending with the seventh delay unit 2(7)).

Consequently, the output (digital data DT) of the latch and encoder 12 varies depending on the level of the input voltage Vin. The digital data DT is numerical data resulting from analog-to-digital conversion of the input voltage Vin.

In the analog-to-digital conversion device shown in FIG. 8A, the transfer rate SP at which the input pulse Pin is transferred within the pulse delay circuit 10 varies, as shown in FIG. 9B, in proportion to the input voltage Vin that is applied as a driving voltage to each delay unit 2. The latch and encoder 12 is therefore used to measure the number of delay units 2, through which the input pulse Pin has passed, at intervals of a predetermined sampling cycle TS. Thus, the input voltage Vin is converted into numerical data (digital data DT).

The analog-to-digital conversion device shown in FIG. 8B is different from the analog-to-digital conversion device shown in FIG. 8A in the point that the first delay unit 2 included in the pulse delay circuit 10 is realized with an AND gate one of whose input terminals serves as an activation terminal. The other input terminal of the first delay unit 2 is connected to the output terminal of the last delay unit 2, whereby all the delay units 2 are concatenated annularly. Thus, the pulse delay circuit 10 is constructed as a ring delay line (RDL) having the input pulse Pin circulated through it. Furthermore, a counter 16 and a latching circuit 18 are included in the analog-to-digital conversion device. The counter 16 counts the number of times by which the input pulse Pin is circulated within the pulse delay circuit 10. The latching circuit 18 latches the count value produced by the counter 16 at the leading edge (or trailing edge) of the sampling signal CKS.

In the analog-to-digital conversion device having the foregoing circuitry, digital data provided by the latch and encoder 12 is digital data DT whose low-order bits a are assigned to the level of the input voltage Vin and whose high-order bits b are assigned to the count value transferred from the latching circuit 18. Compared with the analog-to-digital conversion device shown in FIG. 8A, the number of delay units 2 constituting the pulse delay circuit 10 can be decreased.

As shown in FIG. 8C, in the foregoing conventional analog-to-digital conversion devices, the number of delay units through which the input pulse Pin has passed is numerically calculated at intervals of a certain sampling cycle TS. Thus, the input voltage Vin is converted into the numerical data (digital data DT). The resolution in analog-to-digital conversion is determined with the time (delay time) required for the input pulse Pin to pass through each delay unit 2.

The delay time to be given by the delay unit 2 is determined with the properties of the gate circuits realizing the delay units. In order to improve the resolution in analog-to-digital conversion performed by the conventional analog-to-digital conversion devices, the unit delay time to be given by each gate circuit must be shortened through sophistication of the gate circuit manufacturing technology. This poses a problem in that improvement of the resolution in analog-to-digital conversion is limited by the gate circuit manufacturing technology.

FIG. 10 is an explanatory diagram showing the relationship among a resolution for a voltage that is a digitized value, a delay time given by each delay unit 2 (unit delay time Td), and a rule for use in manufacturing a microstructural CMOS inverter (CMOS design rule). Herein, the delay unit 2 included in the analog-to-digital conversion device shown in FIG. 8A is realized with two CMOS inverters, and the analog-to-digital conversion device acts at the frequency of the sampling signal CKS (sampling frequency) of 10 kHz and at the ambient temperature of 25° C. In order to improve the resolution for the voltage that is a digitized value produced by the conventional A/D conversion devices, the CMOS design rule must be made smaller so that the unit delay time Td to be given by the delay unit 2 will be shorter. For this purpose, there is no way other than a wait for sophistication of the microstructure manufacturing technology required for manufacturing a gate circuit that realizes the delay unit 2.

Moreover, in the conventional A/D conversion devices, the sampling cycle TS should be shortened in order to increase an analog-to-digital conversion rate. However, shortening the sampling cycle TS leads to a decrease in the number of bits constituting digital data produced in proportion to the input voltage Vin, and eventually to a reduction in a resolution. Therefore, the analog-to-digital conversion devices cannot be adapted to an application requiring high-speed analog-to-digital conversion that yields a desired resolution (for example, 10 bits and 1 MHz) because of the insufficient conversion rate.

On the other hand, in the conventional analog-to-digital conversion devices, the delay time to be given by each of the delay units 2 constituting the pulse delay circuit not only varies depending on the input voltage Vin but also varies depending on the environment for use such as ambient temperature. Namely, although the input voltage Vin remains unchanged, when the temperature is low, the delay time given by each delay unit 2 becomes shorter. Consequently, the transfer rate SP of the input pulse Pin within the pulse delay circuit 10 assumes a value, as shown in FIG. 9B, attained when the input voltage Vin is high. In contrast, when the temperature is high, the delay time given by each delay unit 2 becomes longer. Therefore, the transfer rate SP of the input pulse Pin within the pulse delay circuit 10 assumes a value, as shown in FIG. 9B, attained when the input voltage Vin is low.

In efforts to solve the foregoing problems, the technologies disclosed in, for example, Japanese Unexamined Patent Publication Applications Nos. 7-154256, 5-37378, 11-44585, and 11-64135 are utilized. Namely, both the input voltage Vin that is an object of analog-to-digital conversion and a constant reference voltage are digitized, a ratio of the resultant data items is calculated, and a variation of the digitized value of the input voltage Vin deriving from an environmental change is canceled. According to this countermeasure, the analog-to-digital conversion of the input voltage Vin and the analog-to-digital conversion of the reference voltage must be performed sequentially by switching inputs of the analog-to-digital conversion device. It therefore takes too much time to work out a desired digitized value. Moreover, a switching circuit for switching the inputs of the analog-to-digital conversion device and a circuit for canceling a variation must be included additionally. This poses a problem in that the configuration of the A/D conversion device becomes complex and the cost thereof increases.

SUMMARY OF THE INVENTION

The present invention attempts to solve the aforesaid problems. The first object of the present invention is to provide an analog-to-digital conversion device that converts an input voltage into numerical data by utilizing pulse delay circuits each of which has a plurality of delay units connected in tandem. Herein, the analog-to-digital conversion device can offer a high resolution in analog-to-digital conversion and a high analog-to-digital conversion rate. The second object is to provide an analog-to-digital conversion device that can provide a digitized value that remains stable irrespective of an environmental change such as a change in temperature.

According to the first aspect of the present invention, there is provided an analog-to-digital conversion method intended to accomplish the first object. Herein, two pulse delay circuits (first and second pulse delay circuits) are used to convert an input voltage Vin to numerical data (digital data).

According to the method in which the present invention is implemented, an input voltage Vin that is an object of analog-to-digital conversion is applied to the first pulse delay circuit as a signal that is used to control a delay time to be given by each of the first delay units constituting the first pulse delay circuit. The input voltage Vin is applied to the second pulse delay circuit as a signal that is used to control a delay time to be given by each of second delay units constituting the second pulse delay circuit. At this time, the input voltage Vin is applied as the signal to be used to control the delay time in a direction opposite to a direction in which the delay time is controlled within the first pulse delay circuit. Namely, when the delay time to be given by each of the first delay units is shortened, the delay time to be given by each of the second delay units gets longer. When the delay time to be given by the first delay unit is extended, the delay time to be given by the second delay units gets shorter.

Consequently, when the input voltage Vin is high, if the transfer rate at which a pulsating signal is transferred within the first pulse delay circuit is raised, the transfer rate at which a pulsating signal is transferred within the second pulse delay circuit is lowered. In contrast, when the input voltage Vin is low, if the transfer rate at which the pulsating signal is transferred within the first delay circuit is lowered, the transfer rate at which the pulsating signal is transferred within the second pulse delay circuit is raised.

According to the method in which the present invention is implemented, the pulse delay circuits are activated in this state and the pulsating signals are transferred within the pulse delay circuits. The ratio of the transfer rates at which the pulsating signals are transferred within the pulse delay circuits is numerically calculated. The input voltage Vin is thus converted into numerical data.

According to the method in which the present invention is implemented, as mentioned above, when the input voltage Vin is high and the transfer rate at which the pulsating signal is transferred in the first pulse delay circuit is raised, the ratio of the transfer rate to the lower transfer rate at which the pulsating signal is transferred within the second pulse delay circuit is numerically calculated. Consequently, a larger value can be set as numerical data (digital data) to be transmitted as the result of analog-to-digital conversion. In contrast, when the input voltage Vin is low and the transfer rate at which the pulsating signal is transferred within the first pulse delay circuit is low, the ratio of the transfer rate to the higher transfer rate at which the pulsating signal is transferred within the second pulse delay circuit is numerically calculated. Consequently, a smaller value can be set as the numerical data (digital data) to be transmitted as the result of analog-to-digital conversion.

According to the method in which the present invention is implemented, compared with the conventional analog-to-digital conversion methods for converting an input voltage Vin into numerical data using one pulse delay circuit, a resolution to the degree of which a voltage can be discriminated as obtained numerical data (digital data) can be improved. Namely, according to the method in which the present invention is implemented, unlike the conventional methods, a resolution in analog-to-digital conversion can be, as indicated with a dashed-line arrow in FIG. 10, improved up to a desired degree without any limitation imposed by a manufacturing technique adopted to manufacture a delay unit (a CMOS design rule).

Moreover, for example, when the resolution in analog-to-digital conversion is set to the same degree as the resolution offered by the conventional methods, the time required to measure (that is, a sampling cycle) a transfer rate at which a signal is transferred within each pulse delay circuit, in order to offer the resolution, can be shortened. Therefore, according to the method in which the present invention is implemented, compared with the conventional methods, the time required to digitize the input voltage Vin at a desired resolution can be shortened and an analog-to-digital conversion rate can be raised.

According to the analog-to-digital conversion method in which the first aspect of the present invention is implemented, the input voltage Vin that is an object of analog-to-digital conversion is applied to a first pulse delay circuit as a signal that is used to control a delay time to be given by each of first delay units constituting the first pulse delay circuit. The input voltage Vin is applied to a second pulse delay circuit as a signal that is used to control a delay time to be given by each of second delay units constituting the second pulse delay circuit. At this time, the input voltage Vin is applied in order to control the delay time in a direction opposite to a direction in which the delay time is controlled within the first pulse delay circuit. According to a method in which the second aspect of the present invention is implemented, the applications of the signals can be realized readily.

According to the analog-to-digital conversion method in which the second aspect of the present invention is implemented, a signal produced by amplifying the input voltage Vin at an amplification factor of n or a signal produced by adding a predetermined first offset voltage to the signal resulting from amplification is applied to the first pulse delay circuit as a signal that is used to control a delay time to be given by each first delay unit. A signal produced by amplifying the input voltage Vin at an amplification factor of m (where m and n are values having mutually opposite signs of plus and minus) or a signal produced by adding a predetermined second offset voltage to the signal resulting from amplification is applied to the second pulse delay circuit as a signal that is used to control the delay time to be given by each second delay unit.

Consequently, according to the analog-to-digital conversion method having the second aspect of the present invention implemented therein, a direction in which a voltage applied to the first pulse delay circuit varies with a variation of the input voltage Vin is opposite to a direction in which a voltage applied to the second pulse delay circuit varies therewith. Consequently, the delay time given by each of the delay units (first or second delay units) constituting one of the pulse delay circuits can be changed based on the input voltage Vin in a direction opposite to a direction in which the delay time given by each of the delay units constituting the other pulse delay circuit is changed.

The amplification factor n or m by which the input voltage Vin is amplified in order to produce the voltage to be applied to each pulse delay circuit should be set to a proper value according to a variance of the input voltage Vin that is an object of analog-to-digital conversion. For example, if the variance of the input voltage Vin is too large, the amplification factors n and m should be set to values smaller than 1. If the variance of the input voltage Vin is too small, the amplification factors n and m should be set to values larger than 1. If the variance of the input voltage Vin is appropriate for analog-to-digital conversion, the amplification factors n and m should be set to 1s.

Moreover, the first and second offset voltages are used to keep the voltage, which is applied to each pulse delay circuit, positive all the time when the input voltage Vin varies positively and negatively with respect to a ground potential in each pulse delay circuit. The offset voltages should be set to proper levels according to the input voltage Vin that is an object of analog-to-digital conversion.

For example, assume that the amplification factors n and m by which the input voltage Vin is amplified in order to produce the signals to be applied to the pulse delay circuits or the first and second offset voltages are set to the same value. In this case, the transfer rates at which pulsating signals are transferred in the two pulse delay circuits (first and second pulse delay circuits) can be changed in mutually opposite directions in units of the same value. Compared with the case where one pulse delay circuit is used to digitize the input voltage Vin, a resolution in analog-to-digital conversion can be doubled. Otherwise, for example, the amplification factors n and m by the input voltage Vin is amplified in order to produce the signals to be applied to the pulse delay circuits or the first and second offset voltages may be set to different values. In this case, the resolution in analog-to-digital conversion can be set to any value dependent on the ratio of the values.

An analog-to-digital conversion method having the third aspect of the present invention implemented therein is intended to accomplish the aforesaid second object. Similarly to the analog-to-digital conversion method having the first aspect thereof implemented therein, two pulse delay circuits (first and second pulse delay circuits) are used to convert the input voltage Vin to numerical data (digital data). A difference from the analog-to-digital conversion method having the first aspect implemented therein lies in utilization of the second pulse delay circuit.

To be more specific, according to the present method, the input voltage Vin that is an object of analog-to-digital conversion is applied to the first delay circuit as a signal that is used to control a delay time to be given by each of the first delay units constituting the first pulse delay circuit. A predetermined reference voltage is applied to the second pulse delay circuit as a signal that is used to control a delay time to be given by each of the second delay units constituting the second pulse delay circuit. In this state, the pulse delay circuits are activated, and pulsating signals are transferred within the pulse delay circuits. The ratio of the transfer rates at which the pulsating signals are transferred within the pulse delay circuits is numerically calculated. Thus, the input voltage Vin is converted into numerical data.

According to the present method, an error in analog-to-digital conversion stemming from an environmental change such as a change in temperature can be canceled out by a change in the delay time given by each of the delay units constituting each pulse delay circuit. This leads to a decrease in the error in analog-to-digital conversion.

Specifically, according to the present method, the reference voltage is applied to the second pulse delay circuit as a signal that is used to control the delay time to be given by each of the second delay units. However, for an environmental change such as a change in temperature, the delay time given by each of the second delay units constituting the second pulse delay circuit remains constant. For example, when the ambient temperature rises, the delay time gets longer. In contrast, when the ambient temperature drops, the delay time gets shorter. At this time, the delay time given by each of the first delay units constituting the first pulse delay circuit changes accordingly. According to the present method, the ratio of the transfer rates at which pulsating signals are transferred in the pulse delay circuits is numerically calculated. The input voltage Vin is thus digitized. During the numerical calculation, the change in the delay time given by each of the delay units which is derived from the change in an environment such as a change in temperature occurring in each pulse delay circuit, is canceled.

Consequently, according to the present method, a digitized value that is stable (numerical data) can be provided while being unaffected by the environmental change such as a change in temperature. An error in analog-to-digital conversion can be reduced.

According to the present method, analog-to-digital conversion of the input voltage Vin is performed concurrently with analog-to-digital conversion of the reference voltage. Compared with the conventional analog-to-digital conversion devices in which analog-to-digital conversion of the input voltage Vin and analog-to-digital conversion of the reference voltage are performed sequentially and corrective calculation is performed thereafter, the analog-to-digital conversion of the input voltage Vin can be achieved at a high rate.

In order to more reliably suppress an error in analog-to-digital conversion by utilizing the present method, the two pulse delay circuits (first and second pulse delay circuits) used for analog-to-digital conversion are preferably designed to have the same circuitry.

According to the fourth aspect of the present invention, even in the analog-to-digital conversion method having the third aspect implemented therein, similarly to the analog-to-digital conversion method having the second aspect implemented therein, a signal produced by adding the first offset voltage of a predetermined level to the input voltage Vin or by adding the first offset voltage to the input voltage Vin amplified at the amplification factor n may be applied to the first pulse delay circuit. The amplification factor n or first offset voltage may be set to a proper value dependent on the variance of the input voltage Vin.

In this case, if the first offset voltage and reference voltage are produced using the same power supply, a variation of the first offset voltage and a variation of the reference voltage, which are derived from a variation of a supply voltage, can be canceled out by changing the delay time to be given by each of the delay units constituting each pulse delay circuit.

In the analog-to-digital conversion methods having the first to fourth aspects implemented therein, the ratio of the transfer rates at which the pulsating signals are transferred in the two pulse delay circuits (first and second pulse delay circuits) is calculated numerically. The input voltage Vin is thus converted into numerical data. According to the fifth aspect of the present invention, when the ratio of the transfer rates is calculated numerically, the number of delay units through which a pulsating signal has passed within each pulse delay circuit is adopted as information representing a transfer rate at which the pulsating signal is transferred within each pulse delay circuit.

In this case, the number of delay units through which the pulsating signal has passed within each pulse delay circuit is measured by counting the number of delay units through which the pulsating signal has passed within each pulse delay circuit during a predetermined time. The ratio of the number of delay units through which the pulsating signal has passed within one pulse delay circuit to the number of delay units through which the pulsating signal has passed within the other pulse delay circuit may then be calculated. According to the sixth aspect of the present invention, the number of first delay units through which the pulsating signal has passed within the first pulse delay circuit until the number of second delay units through which the pulsating signal has passed within the second pulse delay circuit reaches a pre-set number of delay units is calculated as information representing the ratio of transfer rates at which the pulsating signals are transferred within the pulse delay circuits. This obviates the necessity of calculating the ratio of transfer rates. A digitized value (numerical data) of the input voltage Vin can be provided very easily.

Moreover, according to the analog-to-digital conversion method having the fifth or sixth aspect implemented therein, the number of delay units through which a pulsating signal has passed within each pulse delay circuit is used as information representing a transfer rate at which the pulsating signal is transferred within each pulse delay circuit. In this case, the first and second pulse delay circuits are, unlike the pulse delay circuit shown in FIG. 8A, not designed to have delay units connected merely in tandem. According to the seventh aspect of the present invention (like the pulse delay circuit shown in FIG. 8B), the first and second pulse delay circuits are realized with ring delay lines each of which has the first or second delay units connected annularly and which has a pulsating signal circulated through it. The number of delay units through which the pulsating signal has passed within each pulse delay circuit may be calculated based on the number of times by which the pulsating signal has circulated through the ring delay line or calculated based on the number of times by which the pulsating signal has circulated through the ring delay line and the position of the circulating pulsating signal within the ring delay line.

In this case, it is unnecessary to determine the number of delay units constituting each pulse delay circuit according to a sampling cycle during which the number of delay units through which the pulsating signal has passed is counted. Consequently, the number of delay units constituting each pulse delay circuit can be decreased, and the pulse delay circuits (or eventually the analog-to-digital conversion device) can be designed compactly.

According to the eighth aspect of the present invention, an analog-to-digital conversion device digitizes an input voltage Vin according to the analog-to-digital conversion method having the first aspect of the present invention implemented therein.

In the analog-to-digital conversion device, a first input circuit applies the input voltage Vin to a first pulse delay circuit as a signal to be used to control a delay time to be given by each first control unit. A second input circuit applies the input voltage Vin to a second pulse delay circuit as a signal to be used to control a delay time to be given by each second delay unit. A control means activates the pulse delay circuits, and transfers pulsating signals within the pulse delay circuits. The ratio of transfer rates at which the pulsating signals are transferred within the pulse delay circuits is numerically calculated, whereby numerical data representing the input voltage Vin is produced.

In the analog-to-digital conversion device, the input voltage Vin is digitized according to the analog-to-digital conversion method having the first aspect implemented therein. The analog-to-digital conversion device provides the same advantages as the analog-to-digital conversion method having the first aspect implemented therein.

According to the ninth and tenth aspects of the present invention implemented therein, in an analog-to-digital conversion device, the first input circuit and second input circuit included in the analog-to-digital conversion device having the eighth aspect implemented therein are designed in order to adopt the analog-to-digital conversion method having the second aspect implemented therein.

Specifically, in the analog-to-digital conversion device having the ninth aspect implemented therein, the first input circuit includes a first amplification circuit that amplifies an input voltage Vin at the amplification factor n. The first input circuit applies a signal, which is amplified by the first amplification circuit, to the first pulse delay circuit as a signal to be used to control a delay time to be given by each first delay unit. The second input circuit includes a second amplification circuit that amplifies the input voltage Vin at the amplification factor m (where m and n are values having opposite plus and minus signs). The second input circuit applies a signal, which is amplified by the second amplification circuit, to the second pulse delay circuit as a signal to be used to control a delay time to be given by each second delay unit.

According to the analog-to-digital conversion device having the ninth aspect implemented therein, as the two amplification circuits are included, a direction in which a voltage to be applied to the first pulse delay circuit varies and a direction in which a voltage to be applied to the second pulse delay circuit varies are made opposite to each other. As described in conjunction with the analog-to-digital conversion method having the second aspect implemented therein, the delay times to be given by the delay units (first and second delay units) constituting the pulse delay circuits can be changed in mutually opposite directions according to the input voltage Vin.

In the analog-to-digital conversion device having the tenth aspect implemented therein, the first input circuit includes a first voltage shift circuit that adds a first offset voltage to an input voltage Vin or the input voltage Vin amplified by the first amplification circuit. The second input circuit includes a second voltage shift circuit that adds a second offset voltage to the input voltage Vin or the input voltage Vin amplified by the second amplification circuit.

According to the analog-to-digital conversion device having the tenth aspect implemented therein, even if the input voltage Vin that is an object of analog-to-digital conversion varies positively and negatively with respect to the ground potential attained in each pulse delay circuit, the voltage to be applied to each pulse delay circuit can be kept positive by utilizing the first and second offset voltages. The delay time to be given by each of the delay units (first or second delay units) constituting each pulse delay circuit can be changed based on the input voltage Vin.

According to the eleventh aspect of the present invention, an analog-to-digital conversion device digitizes an input voltage Vin according to the analog-to-digital conversion method having the third aspect implemented therein.

In the analog-to-digital conversion device, a first input circuit applies the input voltage Vin to a first pulse delay circuit as a signal to be used to control a delay time to be given by each first delay unit. A second input circuit applies a predetermined reference voltage to a second pulse delay circuit as a signal to be used to control a delay time to be given by each second delay unit. A control means activates the pulse delay circuits, and transfers pulsating signals within the pulse delay circuits. The ratio of transfer rates at which the pulsating signals are transferred within the pulse delay circuits is numerically calculated, whereby numerical data representing the input voltage Vin is produced.

In the analog-to-digital conversion device, the input voltage Vin is digitized according to the analog-to-digital conversion method having the third aspect implemented therein. The analog-to-digital conversion device provides the same advantages as the analog-to-digital conversion method having the third aspect implemented therein.

According to the twelfth and thirteenth aspects of the present invention, in an analog-to-digital conversion device, the first input circuit included in the analog-to-digital conversion device having the eleventh aspect implemented therein is designed in order to adopt the analog-to-digital conversion method having the fourth aspect implemented therein.

In the analog-to-digital conversion device having the twelfth aspect implemented therein, the first input circuit includes a first voltage shift circuit that adds a first offset voltage of a predetermined level to an input voltage Vin. The first voltage shift circuit adds the first offset voltage to the input voltage Vin and applies the resultant signal to the first pulse delay circuit as a signal to be used to control a delay time to be given by each first delay unit. In the analog-to-digital conversion device having the thirteenth aspect implemented therein, the first input circuit includes a first amplification circuit that amplifies the input voltage Vin at the amplification factor n or amplifies the input voltage Vin, to which the first offset voltage is added by the first voltage shift circuit, at the amplification factor n.

In the analog-to-digital conversion devices having the twelfth and thirteenth aspects implemented therein, the same power supply may be used to produce the first offset voltage and reference voltage. In this case, a variation of the first voltage and a variation of the reference voltage which are derived from a variation of the supply voltage can be canceled out by changing the delay time to be given by each of the delay units constituting each pulse delay circuit. Consequently, an error in analog-to-digital conversion stemming from the variations of the first offset voltage and reference voltage can be minimized.

According to the fourteenth aspect of the present invention, in the analog-to-digital conversion devices having the eleventh to thirteenth aspects implemented therein, the first and second pulse delay circuits are designed to have the same circuitry in order to reliably suppress the error in analog-to-digital conversion.

According to the fifteenth aspect of the present invention, the control means included in the analog-to-digital conversion devices having the eighth to fourteenth aspects implemented therein is designed in order to adopt the analog-to-digital conversion method having the fifth aspect implemented therein. According to the sixteenth aspect of the present invention, the control means included in the analog-to-digital conversion device having the fifteenth aspect implemented therein is designed in order to adopt the analog-to-digital conversion method having the sixth aspect implemented therein.

Specifically, in the analog-to-digital conversion device having the fifteenth aspect implemented therein, the control means includes a first counting means and a second counting means. The first counting means counts the number of first delay units through which the pulsating signal has passed within the first pulse delay circuit. The second counting means counts the number of second delay units through which the pulsating signal has passed within the second pulse delay circuit. The ratio of the numbers of delay units counted by the counting means is numerically calculated, whereby numerical data representing the input voltage Vin is produced.

In the analog-to-digital conversion device having the sixteenth aspect implemented therein, the control means uses the first counting means to count the number of first delay units, through which the pulsating signal has passed within the first pulse delay circuit until the number of second delay units counted by the second counting means reaches a pre-set number of delay units. The result of counting performed by the first counting means is transferred as numerical data representing the input voltage Vin.

According to the analog-to-digital conversion devices having the fifteenth and sixteenth aspects implemented therein, the analog-to-digital conversion method having the fifth or sixth aspect implemented therein can be adopted. The same advantages as those provided by the analog-to-digital conversion methods can be provided.

Next, according to the seventeenth aspect of the present invention, the analog-to-digital conversion device having the sixteenth aspect implemented therein is designed in order to adopt the analog-to-digital conversion method having the seventh aspect implemented therein. The first and second pulse delay circuits are realized with ring delay lines each having first or second delay units concatenated annularly and having a pulsating signal circulated through it.

In the analog-to-digital conversion device having the seventeenth aspect implemented therein, the first counting means includes a first counter and an encoder. The first counter counts the number of times by which the pulsating signal circulates through the ring delay line that realizes the first pulse delay circuit. The encoder converts the position of the pulsating signal, which circulates through the ring delay line that realizes the first pulse delay circuit, into digital data of a predetermined number of bits long, and transfers the digital data. The first counting means latches and transfers the result of counting performed by the first counter and the digital data produced by the encoder according to a sampling signal that is received from outside. The second counting means includes a second counter and a comparator. The second counter counts the number of times by which the pulsating signal circulates through the ring delay ling that realizes the second pulse delay circuit. The comparator judges whether the count value provided by the second counter has reached a set value stipulating the foregoing pre-set number of delay units. When the count value has reached the set value, the comparator transfers a sampling signal to the first counting means. The second counter is reset with the sampling signal sent from the comparator.

According to the analog-to-digital conversion device, the first counter counts the number of times by which the pulsating signal circulates through the first pulse delay circuit until the pulsating signal passes through the set number of second delay units in the second pulse delay circuit and the number of times by which the pulsating signal circulates through the second delay circuit and which is counted by the second counter reaches the set value stipulating the pre-set number of second delay units. Thereafter, the count value provided by the second counter reaches the set value and the comparator transfers the sampling signal. At this time, the first counting means transfers the count value provided by the first counter and digital data that represents the position of the pulsating signal reaches circulating through the first pulse delay circuit and that is produced by the encoder.

According to the analog-to-digital conversion device having the seventeenth aspect implemented therein, the count value sent from the first counting means is acquired as high-order bits, and the digital data representing the position of the pulsating signal circulating through the first pulse delay circuit is acquired as low-order bits. Thus, numerical data (digital data) representing the result of analog-to-digital conversion performed on the input voltage Vin is produced.

According to the analog-to-digital conversion device, the first and second pulse delay circuits are realized with ring delay lines. Similarly to the analog-to-digital conversion method having the seventh aspect implemented therein, it is unnecessary to determine the number of delay units constituting each of the pulse delay circuits according to a maximum time (or in other words, a maximum sampling cycle) that elapses until the comparator transfers the sampling signal after the pulse delay circuits are activated. Consequently, the number of delay units constituting each pulse delay circuit can be reduced, and the pulse delay circuits (eventually, the analog-to-digital conversion device) can be designed compactly.

In the analog-to-digital conversion device having the seventeenth aspect implemented therein, when the count value provided by the second counter reaches the set value, the comparator transfers the sampling signal. The first counting means transfers the count value and digital data which constitute a digitized value of the input voltage Vin. Incidentally, according to the eighteenth aspect of the present invention, the control means includes a signal processing circuit. After the first and second pulse delay circuits are activated, the signal processing circuit latches an output of the first counting means synchronously with the sampling signal sent from the comparator included in the second counting means. The signal processing circuit transfers digital data whose high-order bits are assigned to the result of counting performed by the first counter and whose low-order bits are assigned to digital data produced by the encoder. Consequently, the latest numerical data, that is a digitized value can be transmitted repeatedly at intervals of the cycle of the sampling signal produced by the comparator (sampling cycle).

When an analog-to-digital conversion device is configured according to the eighteenth aspect of the present invention, the cycle of the sampling signal produced by the comparator (sampling cycle) changes based on the level of the input voltage Vin. The cycle during which the analog-to-digital conversion device provides numerical data cannot be held constant. According to the nineteenth aspect of the present invention, if the cycle during which the analog-to-digital conversion device provides numerical data must be held constant, the control means preferably includes the signal processing circuit.

In the analog-to-digital conversion device having the nineteenth aspect implemented therein, the signal processing circuit included in the control means activates the first and second pulse delay circuits synchronously with a master clock of a constant cycle that is received from outside. Consequently, a first counting means and a second counting means act at intervals of the cycle of the master clock. The result of counting performed by the first counter which is transferred from the first counting means and digital data produced by the encoder are latched synchronously with the master clock. Consequently, digital data whose high-order bits are assigned to the result of counting performed by the first counter and whose low-order bits are assigned to the digital data produced by the encoder is provided as numerical data representing the input voltage Vin.

Consequently, according to the nineteenth aspect of the present invention, the analog-to-digital conversion device performs analog-to-digital conversion synchronously with the master clock received from outside. The latest numerical data resulting from the analog-to-digital conversion is transmitted synchronously with the master clock. This results in the analog-to-digital conversion device suitable for a system that must fetch a digitized value synchronously with the master clock.

In the analog-to-digital conversion devices having the seventeenth and eighteenth aspects implemented therein, the comparator included in the second counting means monitors the count value provided by the second counter (or in other words, the number of times by which the pulsating signal circulates through the second pulse delay circuit) to see if the pulsating signal has passed through the pre-set number of second delay units in the second pulse delay circuit. When the pulsating signal has passed through the pre-set number of second delay units in the second pulse delay circuit (when the count value provided by the second counter has reached the set value), the sampling signal is transferred. The properties of the analog-to-digital conversion device (a resolution in analog-to-digital conversion and an analog-to-digital conversion rate) are determined with the timing of transferring the sampling signal from the comparator, or more particularly, the set value pre-set in the comparator. According to the twentieth aspect of the present invention, preferably, the set value in the comparator can be changed arbitrarily from outside.

Specifically, in this case, by changing the set value in the comparator, a user can arbitrarily designate the properties of the analog-to-digital conversion device (a resolution in analog-to-digital conversion and an analog-to-digital conversion rate) as the user desires. This leads to improved user-friendliness of the analog-to-digital conversion device.

The properties of the analog-to-digital conversion device include, in addition to the resolution in analog-to-digital conversion and the analog-to-digital conversion rate, a range of voltages capable of being digitized (dynamic range). In general, the analog-to-digital conversion device is required to offer a wide dynamic range.

In the analog-to-digital conversion devices having the present invention implemented therein and other analog-to-digital conversion devices that use pulse delay circuits to convert an input voltage Vin into numerical data, delay units constituting each pulse delay circuit are realized with gate circuits each of which includes semiconductor devices (transistors and others). The lower the driving voltage is, the larger the linearity of a change in a delay time given by each delay unit is. This is because a triode region incorporated in a transistor becomes dominant.

In the analog-to-digital conversion devices having the present invention implemented therein, when a wide dynamic range is demanded, the lowest level of a signal that is applied to the first and second pulse delay circuit as a signal to be used to control a delay time to be given by each delay unit (that is, a signal proportional to the input voltage Vin) is preferably lowered rather than the highest level thereof being raised.

According to the twenty-first aspect of the present invention, in particular, in the analog-to-digital conversion devices having the fifteenth to twentieth aspects implemented therein, when a wide dynamic range is demanded, the operating supply voltages of the first counting means and second counting means are differentiated from a signal proportional to an input voltage. Herein, the signal proportional to the input voltage is applied as a signal to be used to control a delay time to be given by each of the delay units constituting the first and second pulse delay circuits.

Specifically, a voltage of at least 1.5 V or higher is needed in order to actuate the circuit elements including a counter and constituting the first or second counting means. When voltages applied to the first and second pulse delay circuits are utilized as the operating supply voltages of the first and second counting means, a voltage to be applied to each pulse delay circuit must be 1.5 V or higher.

A gate circuit capable of acting with a voltage of about 0.5 V is available for a gate circuit with which each of delay units constituting a pulse delay circuit is realized. When this type of gate circuit is adopted in order to realize the pulse delay circuit, the lowest level of a voltage needed to control (change) a delay time to be given by each delay unit using a voltage proportional to the input voltage Vin may be about 0.5 V.

Consequently, in the analog-to-digital conversion devices having the fifteenth to twentieth aspects implemented therein, when a wide dynamic range is demanded, voltages to be applied to the first and second pulse delay circuits are preferably not utilized as the operating supply voltages of the first and second counting means. Supply voltages supplied from another power supply should preferably be applied to the first and second counting means.

In this case, the lowest levels of voltages to be applied to the first and second pulse delay circuits can be lowered down to a level near the lowest level of the operating voltage of the gate circuit realizing each of the delay units constituting each pulse delay circuit. Accordingly, the dynamic range offered by the analog-to-digital conversion device can be widened.

According to the twenty-second and twenty-third aspects of the present invention, the seventeenth aspect is implemented in the analog-to-digital conversion devices in which the first and second amplification circuits are included in the first and second input circuits respectively and in which the ninth and tenth aspects are implemented.

In the analog-to-digital conversion device having the twenty-second aspect implemented therein, the first amplification circuit included in the first input circuit amplifies the input voltage Vin at the amplification factor n, and the second amplification circuit included in the second input circuit amplifies the input voltage Vin at the amplification factor m. Herein, the amplification factor n is set to any value ranging from 0.01 to 500, while the amplification factor m is set to any value ranging from −0.01 to −1000.

Assuming that a typical amplification circuit including an operational amplifier is adopted as the first and second amplification circuits, the range of amplification factors permitting stable amplification of the input voltage Vin ranges from about 0.01 to about 1000 according to existing technologies. Moreover, the first pulse delay circuit that acts in response to a signal produced by amplifying the input voltage Vin and provided by the first input circuit must transfer an output of each of the first delay units constituting the first pulse delay circuit to the encoder. Therefore, a permissible variance of a voltage applied from the first input circuit to the first pulse delay circuit cannot be made as large as a permissible variance of a voltage applied from the second input circuit to the second pulse delay circuit.

In the analog-to-digital conversion device having the twenty-third aspect implemented therein, the first amplification circuit included in the first input circuit amplifies the input voltage Vin at the amplification factor n, and the second amplification circuit included in the second input circuit amplifies the input voltage Vin at the amplification factor m. Herein, the absolute value of the amplification factor n is smaller than that of the amplification factor m.

This is because an output of each of the delay units constituting the first pulse delay circuit is restricted by the operating voltage of the encoder. That is to say, in the analog-to-digital conversion device having the twenty-third aspect implemented therein, the absolute value of the amplification factor m at which the second amplification circuit amplifies the input voltage is made larger than that of the amplification factor n at which the first amplification circuit amplifies the input voltage. Herein, the variance of an output of each of the delay units constituting the second pulse delay circuit is not restricted by any external circuit. This results in a large variance of a voltage applied to the second pulse delay circuit. Consequently, the resolution in analog-to-digital conversion performed by the analog-to-digital conversion device has improved.

According to the twenty-fourth aspect of the present invention, the seventeenth aspect thereof is implemented in the analog-to-digital conversion device in which the first and second amplification circuits and the first and second voltage shift circuits are included in the first and second input circuits and in which the tenth aspect is implemented.

In the analog-to-digital conversion device having the twenty-fourth aspect implemented therein, the first amplification circuit included in the first input circuit amplifies the input voltage Vin at the amplification factor n and the first voltage shift circuit included therein adds the first offset voltage to the resultant input voltage. The second amplification circuit included in the second input circuit amplifies the input voltage Vin at the amplification factor m and the second voltage shift circuit included therein adds the second offset voltage to the resultant input voltage. A signal to be applied as a signal to be used to control a delay time to be given by each of the second delay units constituting the second pulse delay circuit varies within a wider range and drops down to a lower level than a signal to be applied as a signal to be used to control a delay time to be given by each of the first delay units constituting the first pulse delay circuit.

In the analog-to-digital conversion device having the twenty-fourth aspect of the present invention implemented therein, as mentioned above, an output of each of the delay units constituting the second pulse delay circuit is not needed to actuate any other circuit. A driving voltage to be applied to each of the delay units constituting the second pulse delay circuit may be lower than that to be applied to each of the delay units constituting the first pulse delay circuit. Moreover, the variance of the driving voltage may be larger. According to the present invention, the amplification factors n and m at which the amplification circuits amplify the input voltage and the offset voltages to be added by the voltage shift circuits are determined based on their properties. This leads to an improved resolution in the analog-to-digital conversion performed by the analog-to-digital conversion device.

BRIEF DESCRIPTION OF THE DRAWINGS

FIG. 1 shows the overall configuration of an analog-to-digital conversion device in accordance with the first embodiment;

FIGS. 2A to 2C are explanatory diagrams concerning the actions of the analog-to-digital conversion device in accordance with the first embodiment;

FIG. 6 is an explanatory diagram concerning the effect of minimizing an error in analog-to-digital conversion performed by the analog-to-digital conversion device in accordance with the second embodiment;

FIG. 7 is an explanatory diagram concerning a practical example of the analog-to-digital conversion device adapted to a sensor signal processing system;

DESCRIPTION OF THE PREFERRED EMBODIMENTS

Embodiments of the present invention will be described below.

FIG. 1 shows the overall configuration of an analog-to-digital conversion device of the first embodiment in which the present invention is implemented.

Figure 8A:
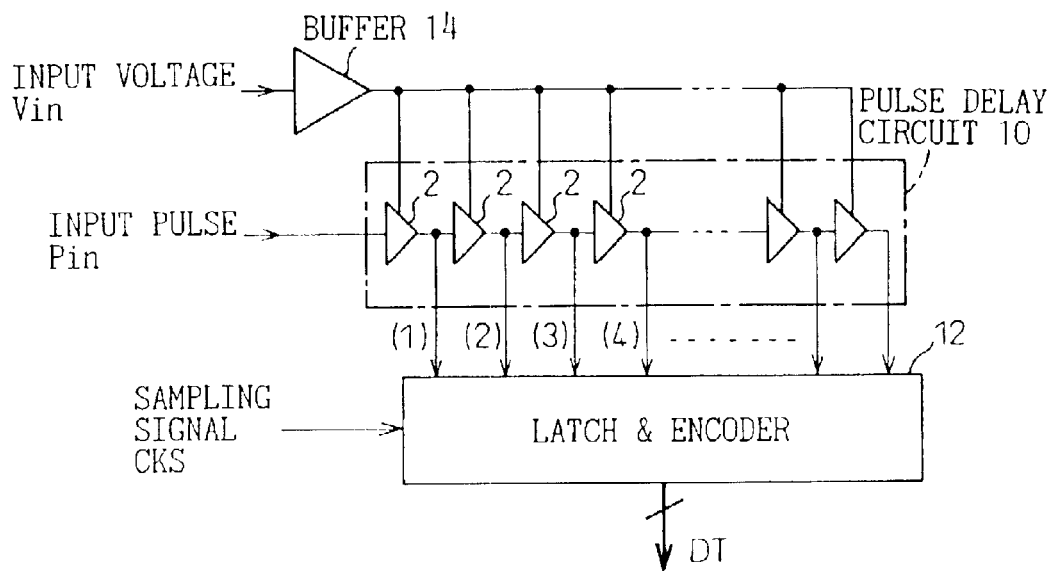
FIGS. 8A and 8B show the configurations of conventional analog-to-digital conversion devices.
Figure 8B:
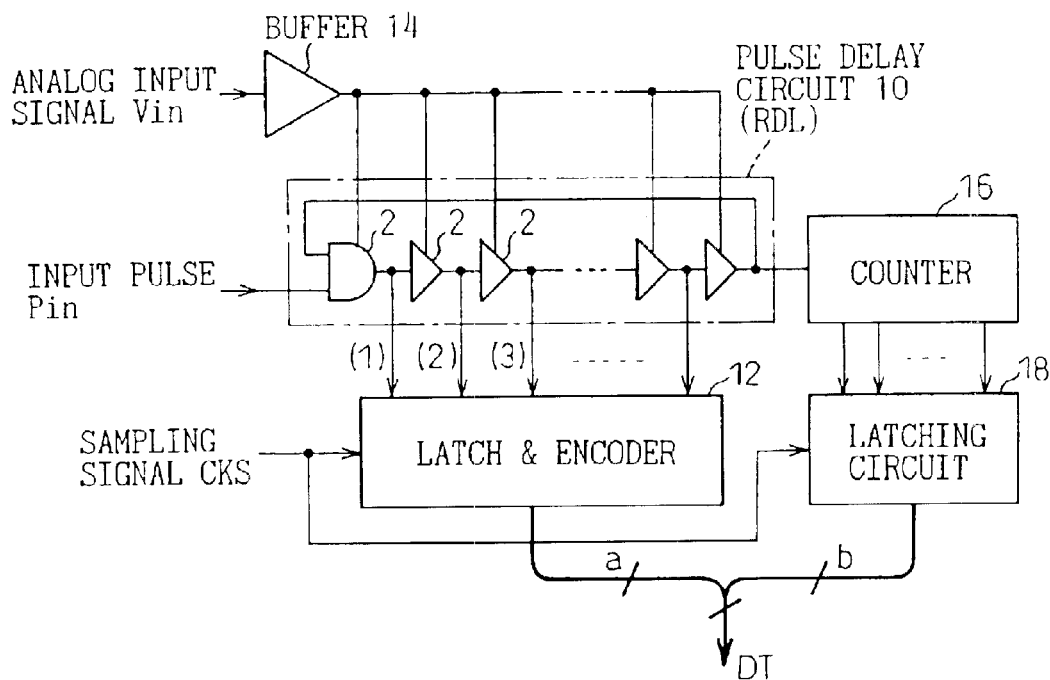
Figure 9A:
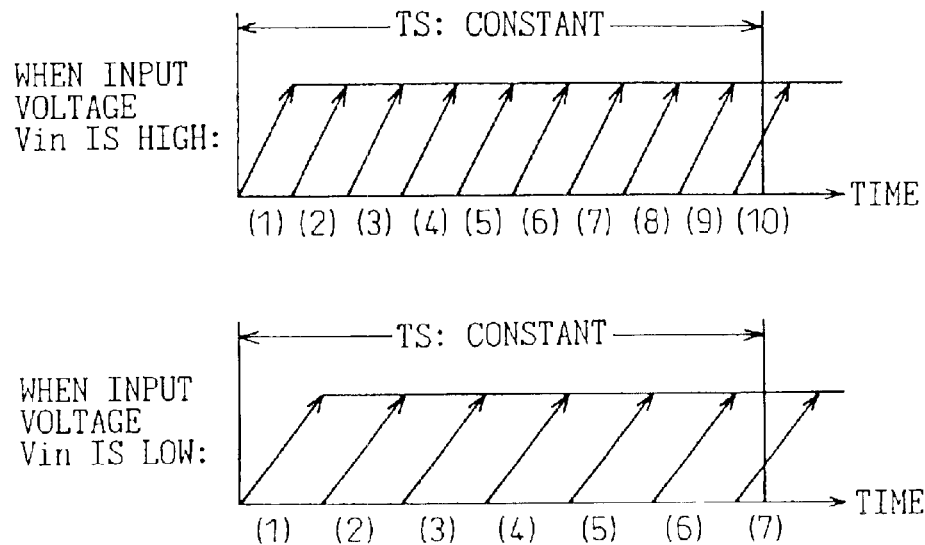
FIGS. 9A to 9C are explanatory diagrams concerning the actions of the conventional analog-to-digital conversion devices.
Figure 9B:
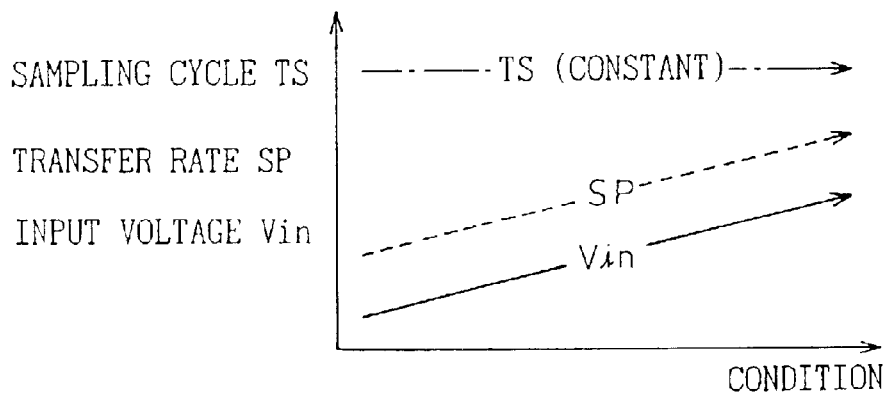
Figure 9C:
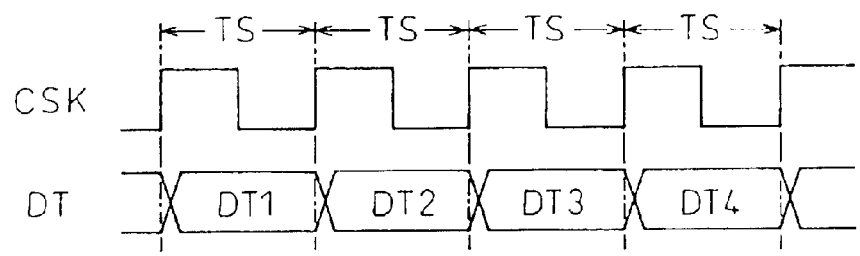
Figure 10:
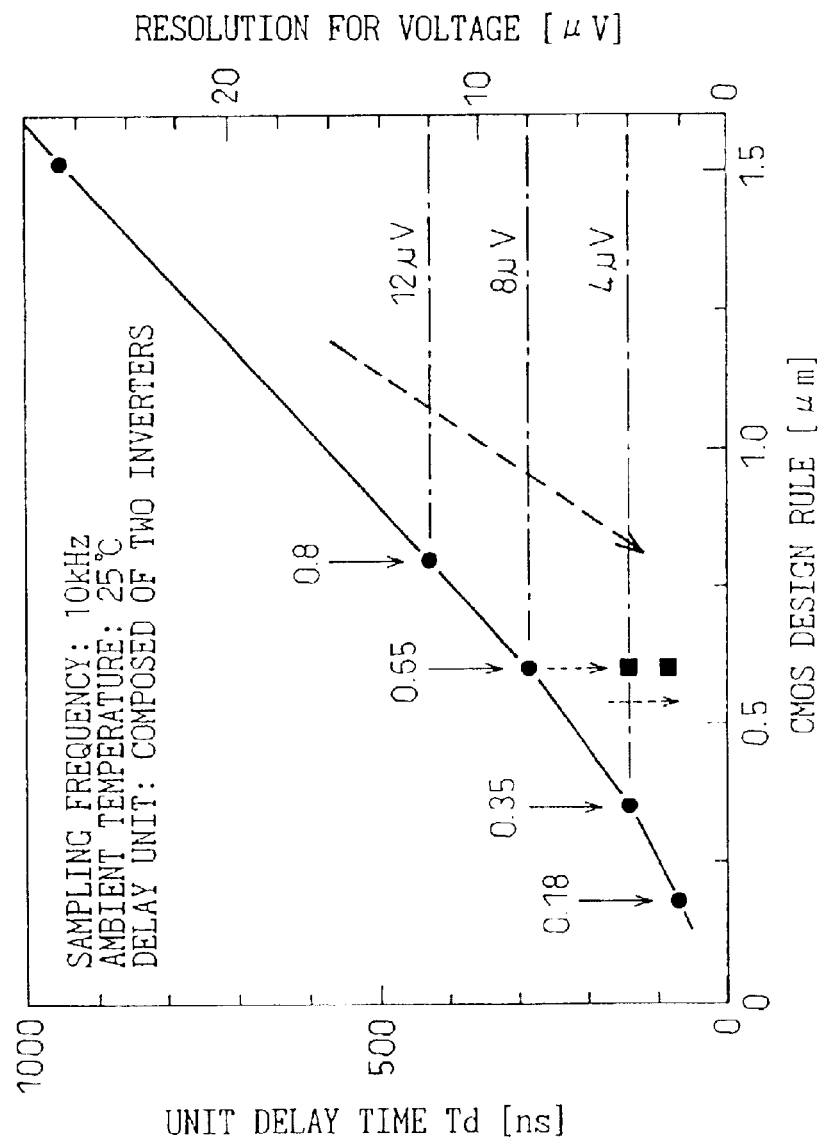
FIG. 10 is an explanatory diagram showing the relationship between a resolution for a voltage which the analog-to-digital conversion device can offer, and a CMOS design rule.

The analog-to-digital conversion device of the present embodiment is a device for converting an input voltage Vin into numerical data according to the analog-to-digital conversion method having the first aspect of the present embodiment implemented therein. Herein, the analog-to-digital conversion device is designed in efforts to accomplish the first object of the present invention (that is, to improve the resolution in analog-to-digital conversion or raise an analog-to-digital conversion rate). Similarly to the conventional analog-to-digital conversion device shown in FIG. 8B, the analog-to-digital conversion device includes an analog-to-digital conversion unit 20 composed of a pulse delay circuit 10 realized with a ring delay line (RDL), a latch and encoder 12, a counter 16, and a latching circuit 18. The pulse delay circuit 10 is equivalent to the first pulse delay circuit employed in the present invention. The latch and encoder 12, counter 16, and latching circuit 18 are equivalent to the first counting means employed in the present invention. Above all, the latch and encoder 12 is equivalent to the encoder employed in the present invention, and the counter 16 is equivalent to the first counter employed therein.

Moreover, the analog-to-digital conversion device of the present embodiment includes, as the second pulse delay circuit employed in the present invention, a pulse delay circuit 30 that has the same circuitry as the pulse delay circuit 10 included in the analog-to-digital conversion unit 20. As the second counting means employed in the present invention, a logic unit 40 composed of a counter 42, a comparator 44, and a buffer 46 is included. The counter 42 counts the number of times by which a pulsating signal P2 circulates through the pulse delay circuit 30. The comparator 44 judges whether the count value provided by the counter 42 has reached a set value NB that stipulates a pre-set number of delay units. If the count value reaches the set value NB, the comparator 44 generates a sampling signal CKS. The buffer 46 transmits the sampling signal generated by the comparator 44 to the outside. The counter 42 is equivalent to the second counter employed in the present invention, and the comparator is equivalent to the comparator employed therein. Moreover, the comparator 44 is designed so that the set value NB can be arbitrarily changed externally.

The input voltage Vin that is an object of analog-to-digital conversion is applied to the pulse delay circuit 10 as a driving voltage to be applied to the delay units (equivalent to the first delay units) 2 constituting the pulse delay circuit 10 included in the analog-to-digital conversion unit 20. According to the present embodiment, the input voltage Vin is not applied to the pulse delay circuit 10 via a buffer or the like as it is. The input voltage Vin is amplified at an amplification factor n by a noninverting amplification circuit 22 serving as the first amplification circuit, and shifted by an adder circuit 24 serving as the first voltage shift circuit to add a pre-set offset voltage Vb1 to the amplified input voltage n·Vin. The resultant voltage Vin1 is applied to the pulse delay circuit 10.

Moreover, the input voltage Vin is applied to the pulse delay circuit 30 as a driving voltage to be used to drive the delay units (equivalent to the second delay units) constituting the pulse delay circuit 30. According to the present embodiment, an inverting amplification circuit 32 serving as the second amplification circuit inversely amplifies the input voltage Vin at an amplification factor −m. Moreover, an adder circuit 34 serving as the second voltage shift circuit adds a pre-set offset voltage Vb2 to the amplified input voltage −m·Vin. Consequently, the resultant voltage Vin2 is applied to the pulse delay circuit 30.

In the analog-to-digital conversion unit 20, the voltage Vin1 to be applied to the pulse delay circuit 10 via the noninverting amplification circuit 22 and adder circuit 24 is provided from a different source to a supply voltage Vdd1 to be applied to the latch and encoder 12, counter 16, and latching circuit 18. Moreover, the voltage Vin2 to be applied to the pulse delay circuit 30 via the inverting amplification circuit 32 and adder circuit 34 is provided from a different source to a supply voltage Vdd2 to be applied to the logic unit 40. Thus, the voltages Vin1 and Vin2 provided from a different source to the supply voltages Vdd1 and Vdd2 in efforts to lower the lowest levels of the voltages Vin1 and Vin2 as much as possible and to eventually offer a wide dynamic range.

The noninverting amplification circuit 22 and adder circuit 24 or the inverting amplification circuit 32 and adder circuit 34 are used to set the upper and lower limits of a variance of the voltage Vin1 or Vin2, which varies depending on the input voltage Vin, to voltage levels suitable for changing a delay time to be given by each of the delay units 2 constituting the pulse delay circuit 10 or 30.

According to the present embodiment, in the pulse delay circuit 10, the latch and encoder 12 acts using an output of each of the delay units 2. The variation of the voltage Vin1 to be applied to the pulse delay circuit 10 which derives from the variations of the input voltage Vin is determined to fall within a range of voltage levels permitting the latch and encoder 12 to act.

In contrast, the pulse delay circuit 30 should merely transfer an output of the last delay unit 2 thereof to the counter 42 and comparator 44 as a timing signal or operating clock that initiates counting. Unlike the pulse delay circuit 10, in the pulse delay circuit 30, an output of each delay unit 2 is not needed to operate any other circuit. The variance of the voltage Vin2 to be applied to the pulse delay circuit 30 which derives from the variations of the input voltage Vin is determined to be as large as possible within a range of voltage levels permitting the pulse delay circuit 30 to act.

According to the present embodiment, the absolute value of the amplification factor m at which the inverting amplification circuit 32 amplifies the input voltage Vin is larger than that of the amplification factor n at which the noninverting amplification circuit 22 amplifies the input voltage Vin. The offset voltages Vb1 and Vb2 are determined proportionally to the ratio of the amplification factors so that the offset voltage Vb2 will be larger than the offset voltage Vb1.

Moreover, the lowest levels of the voltages Vin1 and Vin2 are determined with the offset voltages Vb1 and Vb2. According to the present embodiment, the offset voltages Vb1 and Vb2 are determined so that the lowest level of the voltage Vin1 will be set to the lowest level (about 1 V) within the range of voltage levels permitting the latch and encoder 12 to act and the lowest level of the voltage Vin2 will be set to the lowest level (about 0.5 V) within the range of voltage levels permitting the delay units 2, which constitute the pulse delay circuit 10, to act. The highest levels of the voltages Vin1 and Vin2 are set to the same values as the supply voltages Vdd1 and Vdd2 respectively or values smaller than these.

The pulse delay circuits 10 and 30 are activated with external inputs of activating pulses SRP1 and SRP2 to the first delay units 2 thereof. After the pulse delay circuits 10 and 30 are activated, the pulsating signals P1 and P2 are circulated through the ring delay lines while being sequentially delayed in units of the delay time that is given by each delay unit 2.

In the analog-to-digital conversion unit 20, the counter 16 counts the number of times by which the pulsating signal P1 circulates through the pulse delay circuit 10. Thereafter, when the logic unit 40 transfers a sampling signal CKS, the latch and encoder 12 detects (latches) the position of the pulsating signal P1 circulating through the pulse delay circuit 10, and transfers digital data representing the position of the circulating pulsating signal. The latching circuit 18 latches and transfers the count value (digital data) produced by the counter 16.

An output DT of the latch and encoder 12 and latching circuit 18 is latched by a signal processing circuit 50 synchronously with a sampling signal. The signal processing circuit 50 transmits digital data DT2 whose low-order bits are assigned to the output of the latch and encoder 12 and whose high-order bits are assigned to the output of the latching circuit 18.

In the logic unit 40, the counter 42 counts the number of times by which the pulsating signal P2 circulates through the pulse delay circuit 30. The comparator 44 compares the count value with the set value NB which is the pre-set number of delay units. The comparator 44 waits until the count value provided by the counter 42 reaches the set value NB. If the count value provided by the counter 42 reaches the set value NB, the comparator 44 generates the sampling signal CKS.

The sampling signal CKS is transferred to the latch and encoder 12, latching circuit 18, and signal processing circuit 50 via the buffer 46 as a timing signal indicating the timing of latching, and also transferred to the counter 42 as a reset signal.

Herein, the set value NB pre-set in the comparator 44 defines the number of delay units 2 through which the pulsating signal P1 has passed within the pulse delay circuit 30. After the pulse delay circuit 30 is activated, when the time required for the pulse signal P2 to pass through a predetermined number of delay units 2 that is determined with the set value NB and the number of delay units constituting the pulse delay circuit 30 has elapsed, the comparator 44 transfers the sampling signal CKS.

In the analog-to-digital conversion device of the present embodiment having the foregoing components, when the input voltage Vin is high and the transfer rate at which the pulse signal P1 is transferred within the pulse delay circuit 10 is high, the transfer rate at which the pulse signal P2 is transferred within the pulse delay circuit 30 is low. In contrast, when the input voltage Vin is low and the transfer rate at which the pulse signal P1 is transferred within the pulse delay circuit 10 is low, the transfer rate at which the pulse signal P2 is transferred within the pulse delay circuit 30 is high.

In the analog-to-digital conversion device of the present embodiment, the higher the input voltage Vin is, the longer the time required until the logic unit 40 transfers the sampling signal CKS after the pulse delay circuit 30 is activated (or in other words, the sampling cycle TS) is. The lower the input voltage Vin is, the shorter the time is. In the analog-to-digital conversion device of the present embodiment, therefore, the sampling cycle TS is changed based on the input voltage Vin.

The analog-to-digital conversion unit 20 operates in the same manner as that included in a conventional analog-to-digital conversion device. The number of delay units 2 through which the pulse signal P1 has passed within the pulse delay circuit 10 is measured until the sampling signal CKS is received from the logic unit 40 after the pulse delay circuit 10 is activated. At the timing that the sampling signal CKS is received, the result of measurement is transferred as digital data DT that represents the result of analog-to-digital conversion performed on the input voltage Vin. Unlike the conventional device in which the sampling cycle TS is fixed, the higher the input voltage Vin is, the larger the digital data DT is. The lower the input voltage Vin is, the smaller the digital data DT is.

Figure 2B:
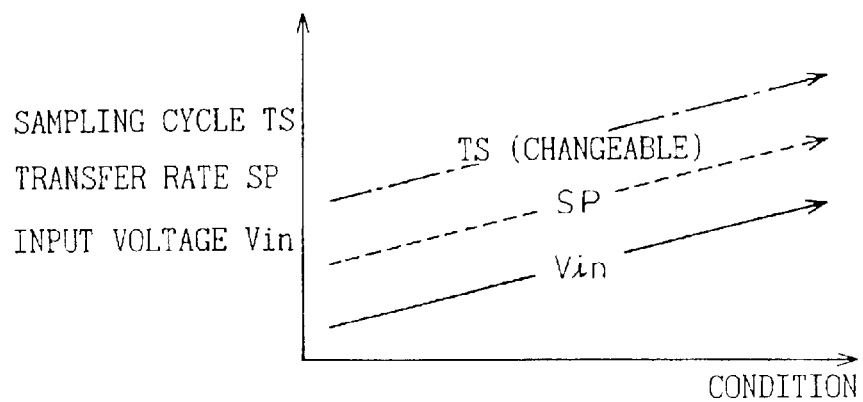

According to the analog-to-digital conversion device of the present embodiment, compared with any conventional device, the resolution in analog-to-digital conversion can be improved. Namely, according to the analog-to-digital conversion device of the present embodiment, the transfer rate SP at which the pulse signal P1 is transferred within the pulse delay circuit 10 changes (increases), as shown in FIG. 2B, proportionally to the input voltage Vin. Moreover, the sampling cycle TS changes (increases) proportionally to the input voltage Vin. Consequently, the input voltage Vin can be digitized at a high resolution owing to the synergistic effect of the changes in the transfer rate SP and sampling cycle TS.

The resolution is not restricted by the delay time to be given by each of the delay units 2 constituting the pulse delay circuit 10, but is determined by the delay times to be given by two delay units 2 included in the two pulse delay circuits 10 and 30 and the ratio of the delay times. According to the present embodiment, the resolution in analog-to-digital conversion that has conventionally been restricted by the delay unit manufacturing technology (CMOS design rule) can be improved up to a desired level.

To be more specific, for example, the pulse delay circuits 10 and 30 are designed to have the same circuitry and the amplification factors (magnifications) n and m at which the noninverting amplification circuit 22 and inverting amplification circuit 32 amplify the input voltage are set to the same value. In this case, the resolution is twice as high as the one attained by any conventional device in which the analog-to-digital conversion unit 20 is used independently. Moreover, in the pulse delay circuit 30, unlike the pulse delay circuit 10, it is unnecessary to operate the latch and encoder 12. A range of voltage levels of the voltage Vin2 to be applied to the pulse delay circuit 30 (or in other words, a dynamic range) is wider than the one of the voltage Vin1. Therefore, as mentioned above, the amplification factors (magnifications) n and m at which the amplification circuits 22 and 32 amplify the input voltage and the offset voltages Vb1 and Vb2 are set to proper values so that the range of voltage levels of the voltage Vin2 will be wider than that of the voltage Vin1. This results in the resolution that is twice to ten times higher than the resolution conventionally attainable.

Moreover, the range of voltage levels of the voltage vin2 may be expanded by raising the highest level of the voltage Vin2. However, in this case, the delay time to be given by each of the delay units 2 constituting the pulse delay circuit 30 may not change proportionally to the voltage Vin2 (linearity decreases). However, in the pulse delay circuit 30, unlike the pulse delay circuit 10, it is unnecessary to operate the latch and encoder 12. The voltage Vin2 may therefore be lowered. Consequently, the problem of linearity can be solved by expanding the range of levels of the voltage Vin2.

In the analog-to-digital conversion device of the present embodiment, after the pulse delay circuit 30 is activated, the counter 42 is reset with the sampling signal CKS sent from the logic unit 40. Therefore, if the activating pulse SRP2 applied to the first delay unit (AND gate) 2 included in the pulse delay circuit 30 is held high, the pulse signal P2 keeps circulating through the pulse delay circuit 30. The counter 42 counts the number of times by which the pulse signal P2 circulates. When the sampling cycle TS determined with the set value NB and the transfer rate SP at which the pulse signal is transferred within the pulse delay circuit 30 has elapsed, the comparator 44 produces the sampling signal CKS. Thereafter, the comparator repeatedly performs this action.

Likewise, in the analog-to-digital conversion unit 20, if the activating pulse SRP1 applied to the first delay unit (AND gate) included in the pulse delay circuit 10 is held high, the pulse signal P1 keeps circulating through the pulse delay circuit 10. Moreover, the latch and encoder 12, latching circuit 18, and signal processing circuit 50 can repeatedly operate in response to the sampling signal CKS sent from the logic unit 40.

Figure 2C:
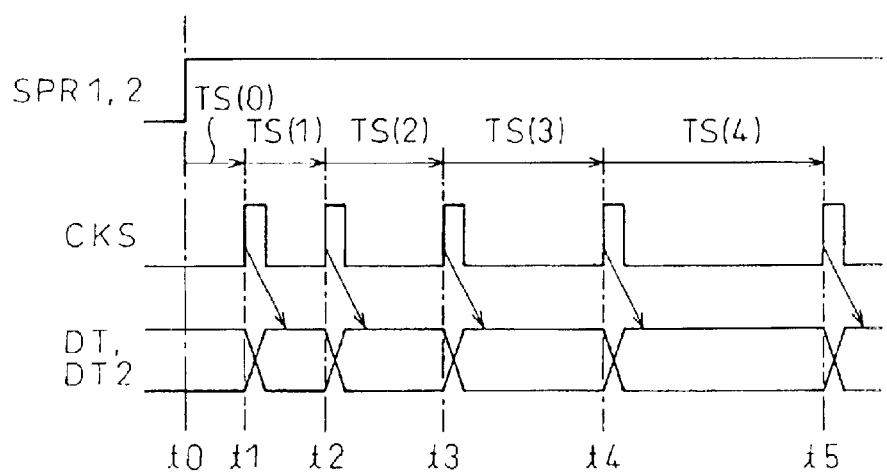

In the analog-to-digital conversion device of the present embodiment, as shown in FIG. 2C, the signal processing circuit 50 or an external unit applies the activating pulses SRP1 and SRP2 to the pulse delay circuits 10 and 30 simultaneously (time instant t0). If the activating pulses SRP1 and SRP2 are held high, the logic unit 40 transmits the sampling signal CKS repeatedly at intervals of a predetermined sampling cycle TS that varies depending on the voltage level of the input voltage Vin, that is, after the elapse of each of sampling cycles TS(0), TS(1), TS(2), etc. (at time instants t1, t2, t3, etc.). The analog-to-digital conversion unit 20 and signal processing circuit 50 transmits digital data items DT and DT2, which represent the levels of the input voltage Vin, synchronously with the sampling signal CKS. In the analog-to-digital conversion device of the present embodiment, the latest result of analog-to-digital conversion can be repeatedly and continuously transmitted by performing the foregoing operations.

In the analog-to-digital conversion device of the present embodiment, the resolution in analog-to-digital conversion can be leveled down to the one offered by a conventional device merely by shortening the sampling cycle TS. For this purpose, the set value NB to be set in the comparator 44 is changed to a smaller value. In the present embodiment, the comparator 44 is designed to allow a user to change the set value NB. The resolution in analog-to-digital conversion (or in other words, an analog-to-digital conversion rate) can be changed very easily. This leads to improved user-friendliness of the analog-to-digital conversion device.

As the delay units 2 constituting each of the pulse delay circuits 10 and 30, any typical type of gate circuit can be adopted as long as the gate circuit can delay the pulsating signal P1 or P2 by a predetermined delay time that varies depending on the voltage Vin1 or Vin2. In order to simplify the circuitry, the second and subsequent delay units 2 are designed to have the circuitry shown in FIG. 3A or FIG. 3B.

Figure 3A:
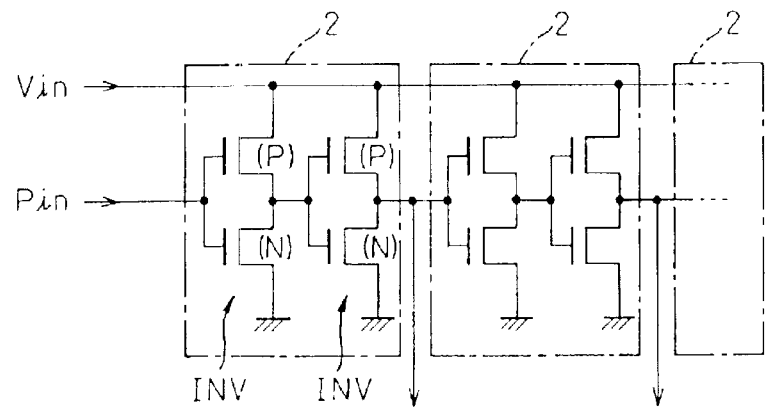
FIGS. 3A to 3C are explanatory diagrams showing examples of the circuitry of a delay unit adopted to construct a pulse delay circuit.
Figure 3B:
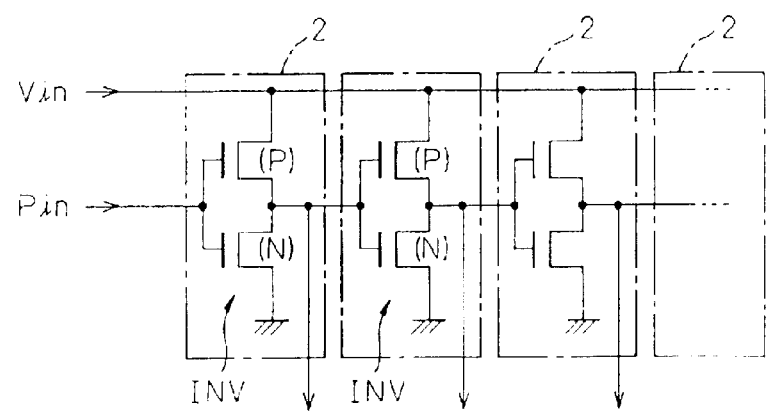

Referring to FIG. 3A, the second and subsequent delay units 2 included in each of the pulse delay circuits 10 and 30 are each composed of two CMOS inverters (NOT circuits). The CMOS inverter includes a p-channel field-effect transistor (FET) and an n-channel field-effect transistor (FET). Consequently, a pulse signal is delayed by a predetermined time determined with the operation times of the p-channel transistor and n-channel transistor constituting each of the back-and-forth CMOS inverters INV. Referring to FIG. 3B, the second and subsequent delay units 2 included in each of the pulse delay circuits 10 and 30 are each realized with a CMOS inverter (NOT circuit) INV including a p-channel field-effect transistor (FET) and an n-channel field-effect transistor (FET). Thus, a pulse signal is delayed by a predetermined time determined with the operation time of the CMOS inverter INV. If either of the circuitries is adopted, the delay unit 2 can be realized with four or two transistors. Besides, each transistor can be fabricated quite easily in the process of manufacturing a CMOS integrated circuit. Consequently, the pulse delay circuits 10 and 30 can be realized at a low cost.

Figure 3C:
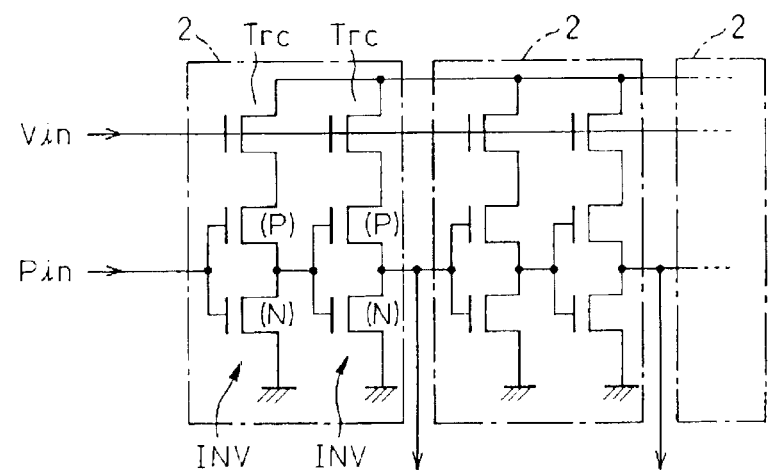

In the present embodiment, the delay time to be given by each of the delay units 2 constituting each of the pulse delay circuits 10 and 30 is controlled based on the voltage level of the voltage Vin1 or Vin2. The voltage Vin1 or vin2 is therefore applied directly to each delay unit 2 as a driving voltage. However, for example, a control field-effect transistor (FET) Trc for permitting control of a driving current from outside may be, as shown in FIG. 3C, connected to a CMOS inverter INV included in each delay unit 2. In this case, the voltage Vin1 or vin2 may be applied to the control terminal (gate) of the control transistor Trc.

According to the present embodiment, the analog-to-digital conversion device repeatedly performs analog-to-digital conversion synchronously with the sampling signal CKS sent from the logic unit 40 (or more particularly, the comparator 44). Depending on a system to which the analog-to-digital conversion device is adapted, it may be better to perform analog-to-digital conversion synchronously with an operating clock (master clock) transferred within the system.

Figure 4A:
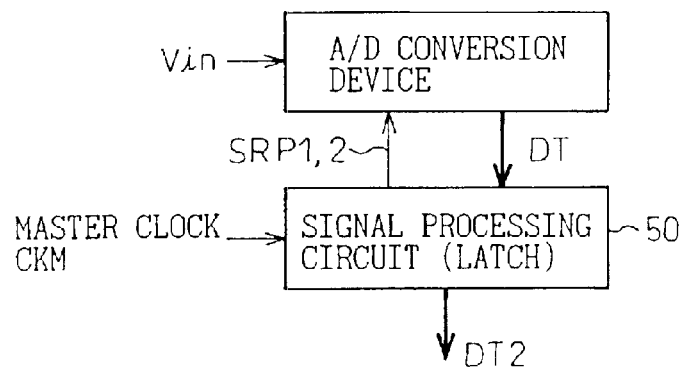
FIGS. 4A to 4C are explanatory diagrams concerning a variant of the analog-to-digital conversion device in accordance with the first embodiment.

For this purpose, as shown in FIG. 4A, a master clock CKM is applied to the signal processing circuit 50, and the signal processing circuit 50 latches an output (digital data DT) sent from the analog-to-digital conversion device (or more particularly, the analog-to-digital conversion unit 20).

Figure 4B:
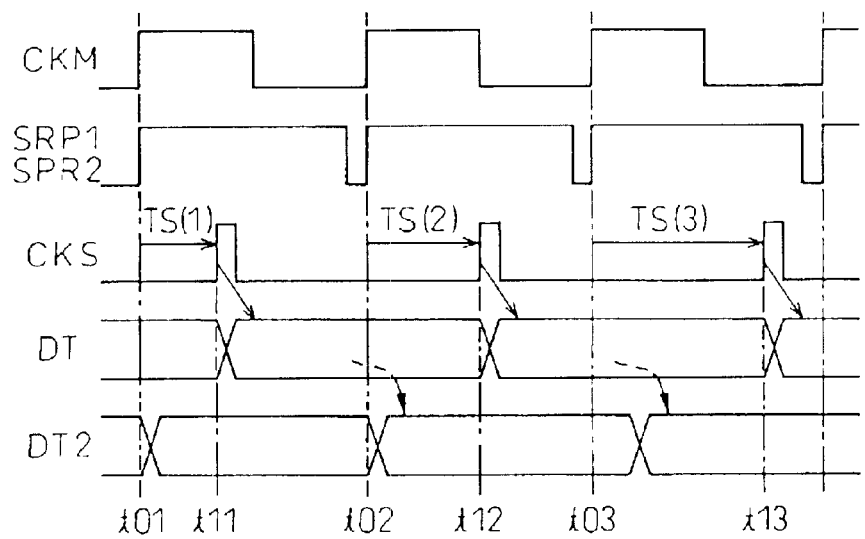

In this case, as the analog-to-digital conversion need not be performed synchronously with the sampling signal CKS, the signal processing circuit 50 transmits, as shown in FIG. 4B, the activating pulses SRP1 and SRP2, which are synchronous with the master clock CKM, to the pulse delay circuits 10 and 30 respectively.

In this case, as shown in FIG. 4B, the pulse delay circuits 10 and 30 are repeatedly activated at time instants t01, t02, t03, etc. at which the master clock CKM rises. After the pulse delay circuits 10 and 30 are activated, an output of the analog-to-digital conversion unit 20 changes to digital data DT, which corresponds to the latest digitized value, at time instants t11, t12, t13, etc. at which the sampling cycle TS that varies depending on the input voltage Vin has elapsed. The digital data DT is latched by the signal processing circuit 50 at the subsequent time instants t02, t03, etc. at which the master clock CKM rises. Consequently, digital data DT2 representing the result of analog-to-digital conversion is transmitted to outside.

Figure 4C:
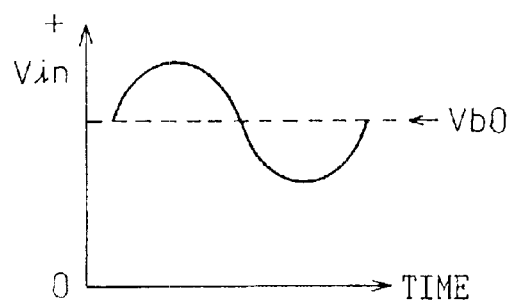

In the present embodiment, the noninverting amplification circuit 22, inverting amplification circuit 32, and adder circuits 24 and 34 are used to optimize the voltage levels of the voltages Vin1 and Vin2, which are applied to the pulse delay circuits 10 and 30 respectively, and the variances thereof. Alternatively, for example, when the input voltage Vin is, as shown in FIG. 4C, positive and the voltage level and variance thereof are appropriate, the input voltage Vin may be applied directly to the pulse delay circuit 10 as a voltage Vin1 to be used to control a delay time. To the pulse delay circuit 30, the input voltage Vin may be applied via a circuit that inverts the changing property of the input voltage Vin (an inverting amplification circuit or an adder circuit for shifting a voltage which are the same as those employed in the embodiment).

Figure 5:
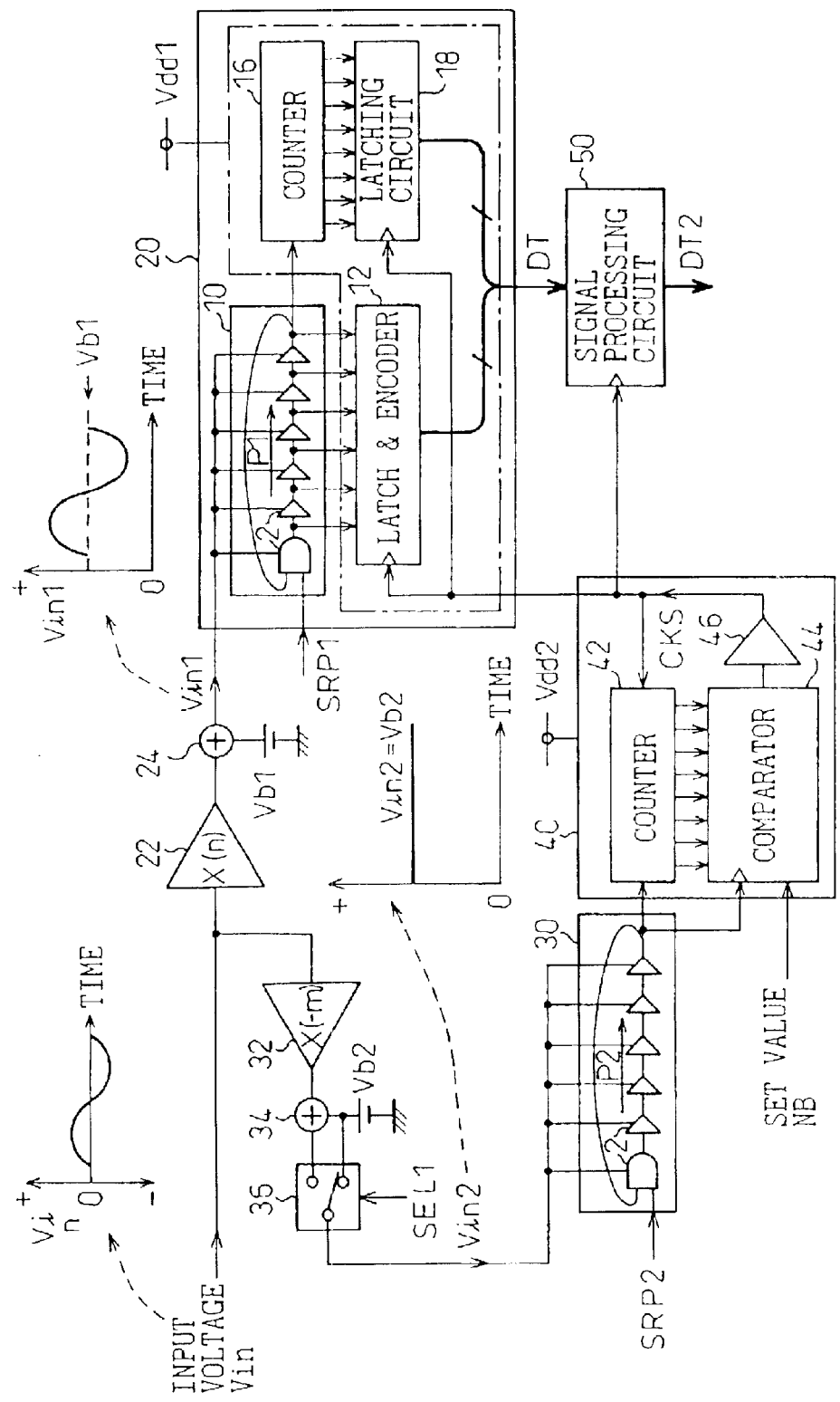
FIG. 5 shows the overall configuration of an analog-to-digital conversion device in accordance with the second embodiment.

FIG. 5 shows an analog-to-digital conversion device of the second embodiment in which an input voltage Vin is converted into numerical data according to the analog-to-digital conversion method that has the third aspect of the present invention implemented therein. The analog-to-digital conversion device of the second embodiment is intended to accomplish the first object of the present invention (to improve the resolution in analog-to-digital conversion and raise an analog-to-digital conversion rate) and the second object thereof (to minimize an error in analog-to-digital conversion stemming from an environmental change such as a change in temperature).

The analog-to-digital conversion device has basically the same configuration as the one of the first embodiment. A difference from the first embodiment lies in the inclusion of a switch 36. The switch 36 is used to switch a voltage produced from the input voltage Vin (resulting from amplification and voltage shift) and an offset voltage Vb2 serving as a reference voltage. The selected voltage is applied to the pulse delay circuit 30 as a voltage Vin2.

In the analog-to-digital conversion device, if the connections through the switch 36 are switched to select the connection to an addition circuit 34, the voltage vin2 that varies depending on the input voltage Vin is applied to the pulse delay circuit 30. Consequently, the operation mode of the analog-to-digital conversion device is set to a resolution up mode. Similarly to the analog-to-digital conversion device of the first embodiment, the analog-to-digital conversion device of the present embodiment can digitize the input voltage Vin at a high resolution (otherwise, at a high conversion rate).

On the other hand, if the connections through the switch 36 are switched to select an offset voltage Vb2 source, the offset voltage Vb2 is applied to the pulse delay circuit 30 as the voltage Vin2. The operation mode of the analog-to-digital conversion device is set to an analog-to-digital conversion error minimization mode. An error component stemming from an environmental change such as a change in temperature is automatically removed from a digitized value (digital data DT) of the input voltage Vin produced by the analog-to-digital conversion unit 20.

In other words, a delay time to be given by each of the delay units 2 constituting the pulse delay circuit 10 included in the analog-to-digital conversion unit 20 changes not only with a variation of the voltage Vin1 that is applied to the delay units 2 as a driving voltage but also with an environmental change such as a change in temperature. More particularly, as shown in FIG. 6, when the ambient temperature is low, the delay time to be given by each delay unit 1 gets shorter. In contrast, when the ambient temperature is high, the delay time to be given by each delay unit gets longer.

When the delay time changes as mentioned above, if the sampling cycle TS is fixed as it is in conventional devices, digital data DT produced by the analog-to-digital conversion unit 20 varies. This results in an error in the result of analog-to-digital conversion.

If an environmental change occurs, the delay time to be given by each of the delay units 2 constituting the pulse delay circuit 30 changes like the one in the pulse delay circuit 10. Consequently, as shown in FIG. 6, when the ambient temperature is low, the cycle of the sampling signal CKS (sampling cycle TS) sent from the logic unit 40 gets shorter. In other words, the sampling cycle TS determined with the offset voltage Vb2 changes with an environmental change such as a change in temperature in the same direction as a direction in which the delay time given by the pulse delay circuit 10 changes.

If the connections through the switch 36 are switched to select the offset voltage Vb2 source, the change in the delay time occurring in the pulse delay circuit 10 due to an environmental change such as a change in temperature is canceled out by a change in the cycle of the sampling signal CKS (sampling cycle TS) sent from the logic unit 40. Digital data sent from the analog-to-digital conversion unit 20 will be unaffected by the change in temperature or the like but is always proportional to the input voltage Vin.

According to the present embodiment, when the analog-to-digital conversion device is operated in the analog-to-digital conversion error minimization mode, an error in analog-to-digital conversion stemming from an environmental change such as a change in temperature can be minimized. Incidentally, the same applies to a case where the offset voltages Vb1 and Vb2 vary.

In order to reliably exert the effect of minimizing an error in analog-to-digital conversion, the pulse delay circuits 10 and 30 are preferably designed to have the circuit elements thereof laid out identically. The offset voltages Vb1 and Vb2 are preferably set to the same voltage level (Vb1=Vb2) and supplied from the same power supply.

FIG. 7 shows a practical example of the analog-to-digital conversion device of the second embodiment that is adapted to a sensor signal processing system which digitally processes a detection signal sent from a sensor and transmits the resultant signal to a microcomputer 51 or the like.

The sensor signal processing system processes detection signals sent from, for example, two kinds of sensor elements A and B (for example, an acceleration sensor A and a pressure sensor B). The sensor signal processing system processes the signals in response to an instruction issued from the microcomputer 51 (or in a time-sharing manner).

The sensor element A includes a detection element A1 that converts a physical quantity (for example, an acceleration) that is an object of sensing into an electric signal, and a reference element A2 that does not sense the physical quantity.

In order to process the detection signal sent from the sensor element A, the connections through a selection switch 52 that selects a detection signal are switched from the connection to the detection element A1 to the connection to the reference element A2 in response to a selection signal SEL2 sent from the microcomputer 51. The detection signals sent from the elements A1 and A2 are successively fetched into the processing system. The detection signals are applied to the analog-to-digital conversion device 100 of the second embodiment via a buffer 54.

In order to process the detection signal sent from the sensor element A, the connections through the switch 36 in the analog-to-digital conversion device 100 are switched to select the connection to the addition circuit 34 in response to a selection signal SEL1 sent from the microcomputer 51. The operation mode of the analog-to-digital conversion device 100 is set to the high-resolution mode.

Consequently, in the analog-to-digital conversion device 100, the detection signals sent from the elements A1 and A2 are converted into digital data items DT2. The digital data items DT2 are successively transmitted synchronously with the sampling signal CKS. Incidentally, the sampling signal CKS produced by the analog-to-digital conversion device 100 is applied to the circuit elements constituting a data processing unit 60 in a succeeding stage.

The data processing unit 60 includes a latching circuit 62 and a latching circuit 64. The latching circuit 62 latches digital data (a detected value) proportional to the detection signal sent from the detection element A1, while the latching circuit 64 latches digital data (a reference value) proportional to the detection signal sent from the reference element A2. The latching circuits 62 and 64 selectively latch associated digital data according to a control signal CO sent from the microcomputer 51 and the sampling signal CKS.

The digital data items (detected value D1 and reference value D2) latched by the latching circuits 62 and 64 are transferred to an arithmetic unit 66. The arithmetic unit 66 calculates the ratio of the values D1 and D2 (division of D1 by D2). The result of calculation D is corrected based on correction data, which is stored in advance in an adjustment/correction memory 68, by a correction unit 70. The resultant data is transmitted to the microcomputer 51 as digital data D0 that represents the physical quantity detected by the sensor element A (for example, an acceleration).

Specifically, the sensor signal processing system calculates the ratio of the detected value D1 produced by the detection element A1 to the reference value D2 produced by the reference element A2 so as to cancel a variation factor caused by a circuit.

On the other hand, in order to process the detection signal produced by the sensor element B, the connections through the switch 36 in the analog-to-digital conversion device 100 are switched to select the connection to the offset voltage Vb2 source. The operation mode of the analog-to-digital conversion device 100 is set to the analog-to-digital conversion error minimization mode. Moreover, the connections through the selection switch 52 for use in selecting a detection signal are switched to select the connection to the sensor element B in response to the selection signal SEL2.

Consequently, the detection signal sent from the sensor element B is applied to the analog-to-digital conversion device 100 via the buffer 54. The detection signal is converted into digital data DT2 very precisely by the analog-to-digital conversion device 100, and then transmitted to the data processing unit 60.

In the data processing unit 60, the received digital data DT is transferred to the correction unit 70 as it is (see a dashed-line arrow in FIG. 7). The correction unit 70 corrects the digital data according to correction data stored in advance in the adjustment/correction memory 68. The resultant data is transmitted to the microcomputer 51 as digital data D0 that represents the physical quantity (for example, a pressure) detected by the sensor element B.

As mentioned above, according to the second embodiment, the analog-to-digital conversion device can be used in different modes. Specifically, for example, when the signal level of a detection signal is relatively high and the detection signal (detection signal sent from the sensor element B) need not be digitized at a high resolution, the analog-to-digital conversion device is operated in the analog-to-digital conversion error minimization mode. When the detection signal should be digitized at a high resolution (detection signal sent from the sensor element A), the analog-to-digital conversion device is operated in the high-resolution mode.

An error in the detection signal (digital data DT) sent from the sensor element B and digitized in the analog-to-digital conversion error minimization mode is automatically corrected by a facility included in the analog-to-digital conversion device. It is therefore unnecessary for the data processing unit 60 to correct digitized data using a reference value. This results in the shortened processing time required by the sensor signal processing system. If the processing time required by the sensor signal processing system is thus shortened, the sensor signal processing system can spend an extra time for processing. The number of sensor elements whose detection signals are processed by the sensor signal processing system can be increased. If the sensor signal processing system is configured using the analog-to-digital conversion device of the second embodiment, a control system including the sensors and sensor signal processing system can be designed compactly at a low cost.

As for the foregoing practical example, the sensor signal processing system has been described by taking an acceleration sensor and a pressure sensor for instance. An analog-to-digital conversion device in which the present invention is implemented can be used to digitize detection signals produced by diverse sensors including temperature sensors, torque sensors, angular rate sensors, and position sensors.

What is claimed is:

1. An analog-to-digital conversion method for converting an input voltage into numerical data, comprising the steps of:
   applying the input voltage to a first pulse delay circuit, which has a plurality of first delay units connected in tandem, as a signal to be used to control a delay time to be given by each first delay unit, the first delay units being realized with gate circuits;
   applying the input voltage to a second pulse delay circuit, which has a plurality of second delay units connected in tandem, as a signal to be used to control a delay time to be given by each second delay unit in a direction opposite to the direction in which the delay time to be given by said first delay circuit is controlled, the second delay units being realized with gate circuits; and
   activating said pulse delay circuits, numerically calculating the ratio of transfer rates at which pulsating signals are transferred within said purse delay circuits, and thus convening the input voltage into numerical data.

2. An analog-to digital conversion method according to claim 1, wherein:
   a signal produced by amplifying the input voltage at an amplification factor n, or a signal produced by adding a predetermined first offset voltage to the amplified input voltage is applied to said first pulse delay circuit as a signal to be used to control the delay time to be given by each first delay unit; and
   a signal produced by amplifying the input voltage at an amplification factor m (where m is a value having an opposite sign to n), or a signal produced by adding a predetermined second offset voltage to the amplified input voltage is applied to said second pulse delay circuit as a signal to be used to control the delay time to be given by each second delay unit.

3. An analog-to-digital conversion method according to claim 1, wherein the number of delay units through which the pulsating signal has passed within each pulse delay circuit is adopted as information representing a transfer rate at which the pulsating signal is transferred within each pulse delay circuit.

4. An analog-to-digital conversion method according to claim 1, wherein the number of first delay units through which the pulsating signal has passed within said first pulse delay circuit until the number of second delay units through which the pulsating signal has passed within said second pulse delay circuit reaches a pre-set number of delay units is calculated as information representing the ratio of transfer rates at which the pulsating signals are transferred within said pulse delay circuits.

5. An analog-to-digital conversion method according to claim 1, wherein:
   a ring delay line having the first or second delay units concatenated annularly and having the pulsating signal circulated through it is adopted as said first and second pulse delay circuits; and
   the number of delay units through which the pulsating signal has passed within each pulse delay circuit is calculated based on the number of times by which the pulsating signal has circulated through each ring delay line or based on the number of times by which the pulsating signal has circulated through each ring delay line and the position of the pulsating signal circulating through each ring delay line.

6. An analog-to-digital conversion method for converting an input voltage to numerical data, comprising the steps of:
   applying the input voltage to a first pulse delay circuit, which has a plurality of first delay units connected in tandem, as a signal to be used to control a delay time to be given by each first delay unit, the first delay units being realized with gate circuits;
   applying a predetermined reference voltage to a second pulse delay circuit, which has a plurality of second delay units connected in tandem, as a signal to be used to control a delay time to be given by each second delay unit, the second delay units being realized with gate circuits; and
   activating said pulse delay circuits, numerically calculating the ratio of transfer rates at which pulsating signals are transferred within said pulse delay circuits, and thus converting the input voltage into numerical data.

7. An analog-to-digital conversion method according to claim 6, wherein a signal produced by adding a predetermined first offset voltage to the input voltage or to a voltage produced by amplifying the input voltage at an amplification factor n is applied to said first pulse delay circuit as a signal to be used to control the delay time to be given by each first delay unit.

8. An analog-to-digital conversion method according to claim 6, wherein the number of delay units through which the pulsating signal has passed within each pulse delay circuit is adopted as information representing a transfer rate at which the pulsating signal is transferred within each pulse delay circuit.

9. An analog-to-digital conversion method according to claim 6, wherein the number of first delay units through which the pulsating signal has passed within said first pulse delay circuit until the number of second delay units through which the pulsating signal has passed within said second pulse delay circuit reaches a pre-set number of delay units is calculated as information representing the ratio of transfer rates at which the pulsating signals are transferred within said pulse delay circuits.

10. An analog-to-digital conversion method according to claim 6, wherein:
   a ring delay line having the first or second delay units concatenated annularly and having the pulsating signal circulated through it is adopted as said first and second pulse delay circuits; and
   the number of delay units through which the pulsating signal has passed within each pulse delay circuit is calculated based on the number of times by which the pulsating signal has circulated through each ring delay line or based on the number of times by which the pulsating signal has circulated through each ring delay line and the position of the pulsating signal circulating through each ring delay line.

11. An analog-to-digital conversion device for converting an input voltage to numerical data, comprising:
   a first pulse delay circuit having a plurality of first delay units, which are realized with gate circuits, connected in tandem, and transferring a pulsating signal while sequentially delaying it in units of a delay time that is given by each first delay unit;
   a first input circuit for applying the input voltage to said first pulse delay circuit as a signal to be used to control the delay time to be given by each first delay unit;
   a second pulse delay circuit having a plurality of second delay units, which are realized with gate circuits, connected in tandem, and transferring a pulsating signal while sequentially delaying it in units of a delay time that is given by each second delay unit;
   a second input circuit for applying the input voltage to said second pulse delay circuit as a signal to be used to control the delay time to be given by each second delay unit; and
   a control means for activating said pulse delay circuits, transferring the pulsating signals within said pulse delay circuits, and numerically calculating the ratio of transfer rates at which the pulsating signals are transferred within said pulse delay circuits.

12. An analog-to-digital conversion device according to claim 11, wherein:
   said first input circuit has a first amplification circuit that amplifies the input voltage at an amplification factor n, and applies the amplified input voltage to said first delay circuit as a signal to be used to control the delay time to be given by each first delay unit; and
   said second input circuit has a second amplification circuit that amplifies the input voltage at an amplification factor m (where m is a value having an opposite sign to n), and applies the amplified input voltage to said second pulse delay circuit as a signal to be used to control the delay time to be given by each second delay unit.

13. An analog-to-digital conversion device according to claim 12, wherein: said first input circuit has a first voltage shift circuit that adds a first offset voltage to the input voltage or to the input voltage amplified by said first amplification circuit; and said second input circuit has a second voltage shift circuit that adds a second offset voltage to the input voltage or to the input voltage amplified by said second amplification circuit.

14. An analog-to-digital conversion device according to claim 11, wherein said control means comprises:
   a first counting means for counting the number of first delay units through which the pulsating signal has passed within said first pulse delay circuit; and
   a second counting means for counting the number of second delay units through which the pulsating signal has passed within said second pulse delay circuit, and
   The ratio of the numbers of delay units counted by said first and second counting means is numerically calculated in order to produce numerical data representing the input voltage.

15. An analog-to-digital conversion device according to claim 14, wherein said control means uses said first counting means to count the number of first delay units through which the pulsating signal has passed within said first pulse delay circuit until the number of second delay units counted by said second counting means reaches a pre-set number of delay units, and transfers the result of counting performed by said first counting means as numerical data representing the input voltage.

16. An analog-to-digital conversion device according to claim 15, wherein:
   said first and second pulse delay circuits are realized with ring delay lines each having said first or second delay units concatenated annularly and having the pulsating signal circulated through it;
   said first counting means includes a first counter that counts the number of times by which the pulsating signal circulates through the ring delay line realizing said first pulse delay circuit, and an encoder that converts the position of the pulsating signal circulating through the ring delay line, which realizes said first pulse delay circuit, into digital data of a predetermined number of bits long and transfers the digital data;
   said first counting means latches and transfers the result of counting performed by said first counter and the digital data produced by said encoder in response to a sampling signal received from outside;
   said second counting means includes a second counter that counts the number of times by which the pulsating signal has circulated through the ring delay line realizing said second pulse delay circuit, and a comparator that judges whether the count value provided by said second counter has reached a set value stipulating the pre-set number of delay units, and that when the count value reaches the set value, transfers the sampling signal to said first counting means; and
   said second counting means resets said second counter according to the timing of the sampling signal sent from said comparator.

17. An analog-to-digital conversion device according to claim 16, wherein said control means includes a signal processing circuit that, after said first and second pulse delay circuits are activated, latches an output of said first counting means synchronously with the sampling signal sent from said comparator included in said second counting means, and that transfers digital data, of which high-order bits are assigned to the result of counting performed by said first counter and of which low-order bits are assigned to digital data produced by said encoder, as numerical data representing the input voltage.

18. An analog-to-digital conversion device according to claim 16, wherein: said control means includes a signal processing circuit; and said signal processing circuit activates said first and second pulse delay circuits synchronously with a master clock of a certain cycle that is received from outside so as to thus actuate said first and second counting means at intervals of the cycle of the master clock, said signal processing circuit latches the result of counting performed by said first counter, which is transferred from said first counting means, and digital data, which is produced by said encoder, synchronously with the master clock, and said signal processing circuit transfers digital data, of which high-order hits are assigned to the result of counting performed by said first counter and of which low-order bits are assigned to the digital data produced by said encoder, as numerical data representing the input voltage.

19. An analog-to-digital conversion device according to any of claim 16, wherein said comparator included in said second counting means permits the s t value, which stipulates the pre-set number of delay units, to be changed from outside.

20. An analog-to-digital conversion device according to claim 14, wherein the operating supply voltages of said first and second counting means are different from the signals that are proportional to the input voltage and that are applied to said first and second pulse delay circuits as signals to be used to control the delay time to be given by each delay unit.

21. An analog-to-digital conversion device according to claim 12, wherein:

said first and second pulse delay circuits are realized with ring delay lines each having said first or second delay units concatenated annularly and having the pulsating signal circulated through it; and said control means comprises:

a first counting means that includes a first counter which counts the number of times by which the pulsating signal circulates through the ring delay line realizing said first pulse delay circuit, and an encoder which converts the position of the pulsating signal, which circulates through the ring delay line realizing said first pulse delay circuit, into digital data of a predetermined number of bits long, said first counting means latching and transferring the result of counting performed by said first counter and the digital data produced by said encoder in response to a sampling signal received from outside;

a second counting means that includes a second counter which counts the number of times by which the pulsating signal circulates through the ring delay line realizing said second pulse delay circuit, and a comparator which judges whether the count value provided by said second counter has reached a set value stipulating the pre-set number of delay units, and which, when the count value reaches the set value, transfers the sampling signal to said first counting means, said second counting means resetting said second counter according to the timing of the sampling signal sent from said comparator; and the amplification factor in at which said first amplification circuit included in said first input circuit amplifies the input voltage is set to any value ranging from 0.01 to 500, and the amplification factor m at which said second amplification circuit included in said second input circuit amplifies the input voltage is set to any value ranging from −0.01 to −1000.

22. An analog-to-digital conversion device according to claim 12, wherein:

said first and second pulse delay circuits are realized with ring delay lines each having said first or second delay units concatenated annularly and having the pulsating signal circulated through it;

said control means comprises:

a first counting means that includes a first counter which counts the number of times by which the pulsating signal circulates through the ring delay line realizing said first pulse delay circuit, and an encoder which converts the position of the pulsating signal, which circulates through the ring delay line realizing said first pulse delay circuit, into digital data of predetermined number of bits long, said first counting means latching and transferring the result of counting performed by said first counter and the digital data produced by said encoder in response to a sampling signal received from outside;

a second counting means that includes a second counter which counts the number of times by which the pulsating signal circulates through the ring delay line realizing said second pulse delay circuit, arid a comparator which judges whether the count value provided by said second counter has reached a set value stipulating the pre-set number of delay units, and which, when the count value reaches the set value, transfers the sampling signal to said first counting means, said second counting means resetting said second counter according to the timing of the sampling signal sent from said comparator; and the absolute value of the amplification factor n at which said first amplification circuit included in said first input circuit amplifies the input voltage is determined to be smaller than that of the amplification factor m at which said second amplification circuit included in said second input circuit amplifies the input voltage.

23. An analog-to-digital conversion device according to claim 13, wherein:

said first and second pulse delay circuits are realized with ring delay lines each having said first or second delay units concatenated annularly and having the pulsating signal circulated through it;

said control means comprises:

a first counting means that includes a first counter which counts the number of times by which the pulsating signal circulates through the ring delay line realizing said first pulse delay circuit, and an encoder which converts the position of the pulsating signal, which circulates through the ring delay line realizing said first pulse delay circuit, into digital data of predetermined number of bits long, said first counting means latching and transferring the result of counting performed by said first counter and the digital data produced by said encoder in response to a sampling signal received from outside;

a second counting means that includes a second counter which counts the number of times by which the pulsating signal circulates through the ring delay line realizing said second pulse delay circuit, and a comparator which judges whether the count value provided by said second counter has reached a set value stipulating the pre-set number of delay units, and which, when the count value reaches the set value, transfers the sampling signal to said first counting means, said second counting means resetting said second counter according to the timing of the sampling signal sent from said comparator;

the amplification factor n at which said first amplification circuit included in said first input circuit amplifies the input voltage and the first offset voltage to be added by said first voltage shift circuit, and the amplification factor m at which said second amplification circuit included in said second input circuit amplifies the input voltage and the second offset voltage to be added by said second voltage shift circuit are determined so that;

a signal that is applied to said second pulse delay circuit as a signal to be used to control the delay time to be given by each second delay unit will vary within a larger range of voltage levels and drop to a lower voltage level than a signal to be applied to said first pulse delay circuit as a signal that is used to control the delay time to be given by each first delay unit.

24. An analog-to-digital conversion device for converting an input voltage into numerical data, comprising:
- a first pulse delay circuit having a plurality of first delay units, which are realized with gate circuits, connected in tandem, and transferring a pulsating signal while sequentially delaying it in units of a delay time that is given by each first delay unit;
- a first input circuit for applying the input voltage to said first pulse delay circuit as a signal to be used to control the delay time to be given by each first delay unit;
- a second pulse delay circuit having a plurality of second delay units, which are realized with gate circuits, connected in tandem, and transferring a pulsating signal while sequentially delaying it in units of a delay time that is given by each second delay unit;
- a second input circuit for applying a predetermined reference voltage to said second pulse delay circuit as a signal to be used to control the delay time to be given by each second delay unit; and
- a control means for activating said pulse delay circuits, transferring the pulsating signals within said pulse delay circuits, and numerically calculating the ratio of transfer rates at which the pulsating signals are transferred within said pulse delay circuits.

25. An analog-to-digital conversion device according to claim 24, wherein: said first input circuit has a first voltage shift circuit that adds a predetermined first offset voltage to the input voltage; and a signal resulting from the addition of the first offset voltage to the input voltage performed by said first voltage shift circuit is applied to said first pulse delay circuit as a signal to be used to control the delay time to be given by each first delay unit.

26. An analog-to-digital conversion device according to claim 25, wherein said first input circuit has a first amplification circuit that amplifies at an amplification factor n the input voltage or a voltage resulting from the addition of the first off set voltage to the input voltage performed by said first voltage shift circuit.

27. An analog-to-digital conversion device according to any of claim 24, wherein said first and second pulse delay circuits have the same circuitry.

28. An analog-to-digital conversion device according to any of claim 24, wherein said control means comprises:
- a first counting means for counting the number of first delay units through which the pulsating signal has passed within said first pulse delay circuit; and
- a second counting means for counting the number of second delay units through which the pulsating signal has passed within said second pulse delay circuit, and the ratio of the numbers of delay units counted by said first and second counting means is numerically calculated in order to produce numerical data representing the input voltage.

29. An analog-to-digital conversion device according to claim 28, wherein said control means uses said first counting means to count the number of first delay units through which the pulsating signal has passed within said first pulse delay circuit until the number of second delay units counted by said second counting means reaches a pre-set number of delay units, and transfers the result of counting performed by said first counting means as numerical data representing the input voltage.

30. An analog-to-digital conversion device according to claim 29, wherein:
said first and second pulse delay circuits are realized with ring delay lines each having said first or second delay units concatenated annularly and having the pulsating signal circulated through it;
said first counting means includes a first counter that counts the number of times by which the pulsating signal circulates through the ring delay line realizing said first pulse delay circuit, and an encoder that converts the position of the pulsating signal circulating through the ring delay line, which realizes said first pulse delay circuit, into digital data of a predetermined number of bits long and transfers the digital data;
said first counting means latches and transfers the result of counting performed by said first counter and the digital data produced by said encoder in response to a sampling signal received from outside;
said second counting means includes a second counter that counts the number of times by which the pulsating signal has circulated through the ring delay line realizing said second pulse delay circuit, and a comparator that judges whether the count value provided by said second counter has reached a set value stipulating the pre-set number of delay units, and that when the count value reaches the set value, transfers the sampling signal to said first counting means; and
said second counting means resets said second counter according to the timing of the sampling signal sent from said comparator.

31. An analog-to-digital conversion device according to claim 30, wherein said control means includes a signal processing circuit that, after said first and second pulse delay circuits are activated, latches an output of said first counting means synchronously with the sampling signal sent from said comparator included in said second counting means, and that transfers digital data, of which high-order bits are assigned to the result of counting performed by said first counter and of which low-order bits are assigned to digital data produced by said encoder, as numerical data representing the input voltage.

32. An analog-to-digital conversion device according to claim 30, wherein: said control means includes a signal processing circuit; and said signal processing circuit activates said first and second pulse delay circuits synchronously with a master clock of a certain cycle that is received from outside so as to thus actuate said first and second counting means at intervals of the cycle of the master clock, said signal processing circuit latches the result of counting performed by said first counter, which is transferred from said first counting means, and digital data, which is produced by said encoder, synchronously with the master clock, and said signal processing circuit transfers digital data, of which high-order bits are assigned to the result of counting performed by said first counter and of which low-order bits are assigned to the digital data produced by said encoder, as numerical data representing the input voltage.

33. An analog-to-digital conversion device according to claim 30, wherein said comparator included in said second counting means permits the set value, which stipulates the pre-set number of delay units, to be changed from outside.

34. An analog-to digital conversion device according to any of claim 28, wherein the operating supply voltages of said first and second counting means are different from the signals that are proportional to the input voltage and that are applied to said first and second pulse delay circuits as signals to be used to control the delay-time to be given by each delay unit.

* * * * *

UNITED STATES PATENT AND TRADEMARK OFFICE
CERTIFICATE OF CORRECTION

PATENT NO. : 6,850,178 B2
DATED : February 1, 2005
INVENTOR(S) : Takamoto Watanabe It is certified that error appears in the above-identified patent and that said Letters Patent is hereby corrected as shown below:

Column 25,
Line 61, "purse" should be -- pulse --
Line 62, "convening" should be -- converting --

Column 29,
Line 7, "hits" should be -- bits --
Line 13, "s t" should be -- set --

Column 30,
Line 14, "arid" should be -- and --
Line 65, "that;" should be -- that: --

Signed and Sealed this

Twelfth Day of July, 2005

JON W. DUDAS
*Director of the United States Patent and Trademark Office*